United States Patent
LaVeigne

(10) Patent No.: US 9,748,214 B2
(45) Date of Patent: Aug. 29, 2017

(54) TECHNIQUES FOR TILING ARRAYS OF PIXEL ELEMENTS AND FABRICATING HYBRIDIZED TILES

(71) Applicant: Joseph Donald LaVeigne, Buellton, CA (US)

(72) Inventor: Joseph Donald LaVeigne, Buellton, CA (US)

(73) Assignee: Santa Barbara Infrared, Inc., Santa Barbara, CA (US)

(*) Notice: Subject to any disclaimer, the term of this patent is extended or adjusted under 35 U.S.C. 154(b) by 0 days.

(21) Appl. No.: 14/887,294

(22) Filed: Oct. 19, 2015

(65) Prior Publication Data

US 2016/0104696 A1    Apr. 14, 2016

Related U.S. Application Data

(63) Continuation-in-part of application No. 13/656,711, filed on Oct. 21, 2012, now Pat. No. 9,163,995.
(Continued)

(51) Int. Cl.
*H01L 25/16*    (2006.01)
*G01J 1/44*    (2006.01)
(Continued)

(52) U.S. Cl.
CPC ............. *H01L 25/167* (2013.01); *G01J 1/44* (2013.01); *G01J 5/02* (2013.01); *G01J 5/024* (2013.01);
(Continued)

(58) Field of Classification Search
CPC ......... H01L 27/14603; H01L 27/14601; H01L 27/14652; H01L 31/0352;
(Continued)

(56) References Cited

U.S. PATENT DOCUMENTS 4,542,397 A    9/1985    Biegelsen et al.
4,573,627 A    3/1986    Miller et al.
(Continued)

FOREIGN PATENT DOCUMENTS

WO    WO 03054954    7/2003

OTHER PUBLICATIONS

A novel method for nanoprecision alignment in wafer bonding applications, Jiang et al., Journal of Micromechanics and Microengineering, 17 (2007) S61-S67, IOP Publishing Ltd.
(Continued)

*Primary Examiner* — Marcus Taningco
(74) *Attorney, Agent, or Firm* — Gerald E. Linden

(57) ABSTRACT

A first substrate having an array of emitters or detectors may be joined by bump bonding with a second substrate having read-in (RIIC) or read-out (ROIC) circuitry. After the two substrates are joined, the resulting assembly may be singulated to form sub-arrays such as tiles sub-arrays having pixel elements which may be arranged on a routing layer or carrier to form a larger array. Edge features of the tiles may provide for physical alignment, mechanical attachment and chip-to-chip communication. The pixel elements may be thermal emitter elements for IR image projectors, thermal detector elements for microbolometers, LED-based emitters, or quantum photon detectors such as those found in visible, infrared and ultraviolet FPAs (focal plane arrays), and the like.

15 Claims, 12 Drawing Sheets

Related U.S. Application Data

(60) Provisional application No. 61/550,350, filed on Oct. 21, 2011.

(51) Int. Cl.

| | |
|---|---|
| *H01L 27/146* | (2006.01) |
| *H01L 31/18* | (2006.01) |
| *H01L 33/00* | (2010.01) |
| *H01L 33/62* | (2010.01) |
| *G01J 5/02* | (2006.01) |
| *G01J 5/20* | (2006.01) |
| *G01J 5/04* | (2006.01) |
| *G01J 5/10* | (2006.01) |

(52) U.S. Cl.
CPC ............... *G01J 5/045* (2013.01); *G01J 5/20* (2013.01); *H01L 27/14649* (2013.01); *H01L 31/186* (2013.01); *H01L 33/0095* (2013.01); *H01L 33/62* (2013.01); *G01J 2005/106* (2013.01); *G01J 2005/202* (2013.01); *H01L 2924/0002* (2013.01); *H01L 2933/0066* (2013.01); *Y10T 29/49002* (2015.01); *Y10T 29/49117* (2015.01)

(58) Field of Classification Search
CPC ....... H01L 31/035281; H01L 27/14649; H01L 27/14669
See application file for complete search history.

(56) References Cited

U.S. PATENT DOCUMENTS

| | | | |
|---|---|---|---|
| 5,528,043 | A | 6/1996 | Spivey et al. |
| 5,600,148 | A | 2/1997 | Cole et al. |
| 5,661,531 | A | 8/1997 | Greene et al. |
| 5,895,233 | A | 4/1999 | Higashi et al. |
| 5,949,429 | A | 9/1999 | Bonneau et al. |
| 5,973,383 | A | 10/1999 | Cole et al. |
| 6,036,872 | A | 3/2000 | Wood et al. |
| 6,046,485 | A | 4/2000 | Cole et al. |
| 6,210,494 | B1 | 4/2001 | Cole et al. |
| 6,444,983 | B1 | 9/2002 | McManus et al. |
| 6,515,723 | B1 | 2/2003 | Suzuki |
| 6,611,050 | B1 | 8/2003 | Ference et al. |
| 7,105,818 | B2 | 9/2006 | Anderson et al. |
| 7,439,513 | B2 | 10/2008 | Pope et al. |
| 7,551,059 | B2* | 6/2009 | Farrier ............... H01L 27/14603 250/208.1 |
| 7,608,919 | B1 | 10/2009 | Bernstein et al. |
| 7,612,443 | B1 | 11/2009 | Bernstein et al. |
| 7,923,845 | B2 | 4/2011 | Krishnamoorthy et al. |
| 8,021,965 | B1 | 9/2011 | Bernstein et al. |
| 8,227,904 | B2 | 7/2012 | Braunisch et al. |
| 9,078,333 | B2 | 7/2015 | LaVeigne et al. |
| 2003/0234343 | A1 | 12/2003 | Cok et al. |
| 2004/0012689 | A1 | 1/2004 | Tinnerino et al. |
| 2004/0157407 | A1 | 8/2004 | Tong et al. |
| 2005/0078104 | A1* | 4/2005 | Matthies ............ G02F 1/13336 345/204 |
| 2009/0290680 | A1* | 11/2009 | Tumer .................... G01T 1/247 378/62 |
| 2010/0258725 | A1 | 10/2010 | Blackwell, Jr. |
| 2012/0133381 | A1 | 5/2012 | Bruland et al. |

OTHER PUBLICATIONS

Ultra-low-power scene projector for targets against space backgrounds, Cole et al., SPIE vol. 1967 / 39.
Micromachined Thermal Radiation Emitter from a Commercial CMOS Process, Parameswaran et al., IEEE Electron Device Letters, vol. 12, No. 2, Feb. 1991.
A Wafer Scale Dynamic Thermal Scene Generator, Chapman et al., IEEE, 1992.
Commercial CMOS Fabricated Integrated Dynamic Thermal Scene Simulator, Parameswaran et al., IEEE, 1991.
Review of infrared scene projector technology—1993, Driggers et al., Optical Engineering/Jul. 1994/vol. 33 No. 7/2417.
Thermal scene projectors using microemitters, Stauffer et al., Optical Engineering / Nov. 1991 / vol. 30 No. 11/1667.
Seamless Tiling of Amorphous Silicon Photodiode-TFT Arrays for Very Large Area X-Ray Image Sensors, Powell et al., IEEE Transactions on Medical Imaging, vol. 17, No. 6, Dec. 1998.
512 × 512 Infrared cryogenic scene projector arrays, Cole et al., Sensors and Actuators A 48 (1995) 193-202.
Focal Plane Array Applications of Quilt Packaging™: An Overview, Innovations in Microelectronics, http://www.indianaic.com.
Quilt Packaging™—Ultrahigh Performance Chip-to-Chip Interconnects, Indiana Integrated Circuits LLC.
Fabrication and characterization of metal-to-metal interconnect structures for 3-D integration, Huffman et al., © 2009, IOP Publishing Ltd and SISSA.
A Study of Through-Silicon-Via Impact on the 3D Stacked IC Layout, Kim et al., ICCAD '09, Nov. 2-5, 2009.
Characterization of the Dynamic Infrared Scene Projector (DIRSP) Engineering Grade Array (EGA), Manzardo et al., SPIE vol. 3697, Apr. 1999.
SWIR FPAs by FLIR Systems, 2012 (http://www.flir.com/cvs/cores/view/?id=51945).
CCD / CMOS Hybrid FPA for Low Light Level Imaging, Liu et al., . . . (http://www.fairchildimaging.com/main/documents/ccd_cmos_hybrid_fpa_for_low_light_level_imaging.pdf).
Introduction to Building Projection-based Tiled Display Systems, Hereld et al., . . . .

* cited by examiner

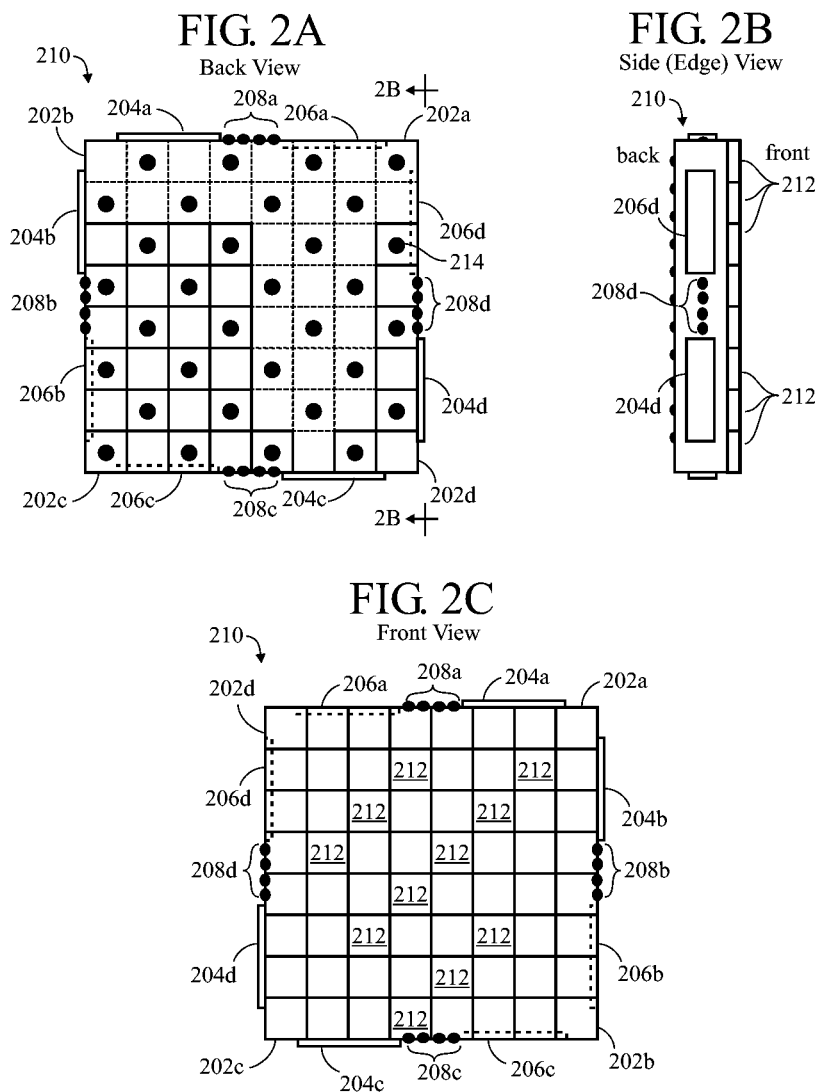

smaller unit cells
biased away from edges of tile smaller active area, biased away
from all four edges of pixel element

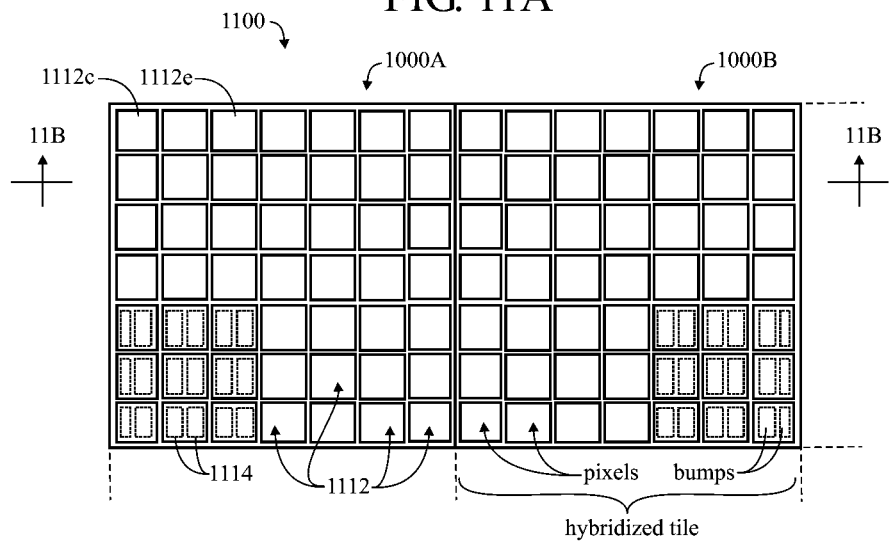
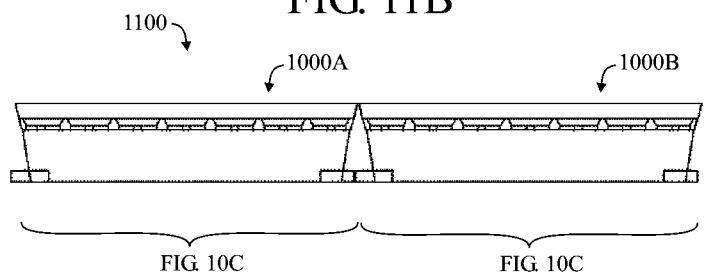

TECHNIQUES FOR TILING ARRAYS OF PIXEL ELEMENTS AND FABRICATING HYBRIDIZED TILES

CROSS-REFERENCE TO RELATED APPLICATION(S)

This is a continuation-in-part of Ser. No. 13/656,711 filed 21 Oct. 2012 (U.S. Pat. No. 9,163,995 20 Oct. 2015) by Laveigne et al., which claims priority from U.S. 61/550,350 filed Oct. 21, 2011.

TECHNICAL FIELD

The invention relates to fabricating and assembling tiles (chips, sub-arrays) of pixel elements into larger arrays, more particularly pixel elements which may be thermal radiation emitters such as resistive pixel elements for infrared (IR) image projection, thermal radiation detectors such as for a microbolometer, and the like.

BACKGROUND

The human eye cannot detect infrared light. But infrared energy can be detected electronically. Sophisticated electronic instruments exist which can scan a scene and convert the infrared light to an electrical signal which can be displayed on a video monitor, analyzed by a computer, or recorded on film. Electrically, the output of these instruments is very similar to the output of a conventional video camera.

Due to their complexity, IR imaging systems are expensive, sensitive, high-maintenance devices. To assure proper operation of these systems and to achieve their full performance requires frequent test and calibration. Engineers, who design IR imaging systems, test them during the design and development stage to evaluate performance parameters and to refine designs to optimize performance. Manufacturers of IR imaging systems need to compare actual performance to specifications, and need to calibrate the systems prior to delivery. End users must test their systems regularly to verify proper operation, and must recalibrate them periodically while they are in the working environment.

Some of the important performance characteristics of an IR imaging system are spatial resolution (ability to resolve fine detail), thermal resolution (ability to resolve small temperature differences), speed (ability to respond to a rapidly changing scene without blurring), and dynamic range (how large a temperature span it can view without saturating). Standard tests have been developed to quantify these characteristics.

IR Test Equipment

Setup, test, and calibration of IR imaging systems requires the use of specialized test equipment. This test equipment is designed to create an infrared scene of precisely known characteristics, to project this scene to the input of the IR imaging system being tested, and to evaluate the quality of the output of the IR imaging system.

Infrared Scene Projector (IRSP)

An Infrared Scene Projector (IRSP) may be used to test a wide variety of sensors used by the US military and major defense contractors. Generally, an IRSP comprises a large number of thermal (IR) emitters, arranged in an array of pixel elements, such as 1024×1024 pixel elements.

The IRSP may use a single chip IR emitter array to produce actual thermal imagery. The emitter array utilizes a large number of pixels to generate the image (similar to how a digital camera uses a large number of pixels to capture an image). Each pixel emits thermal energy that is ultimately captured by the sensor under test. There are many types of emitters such as resistive bridges, Light Emitting Diodes (LEDs), lasers, deformable membranes, micro mirror arrays, etc. Of these emitter types, resistive bridge arrays and micro mirrors are the most widely used. Resistive bridges may offer the best performance in terms of temperature range, speed (frame rate and thermal transition time) and thermal resolution.

Resistive Bridge Pixel Elements

Each pixel element (or "emitter pixel") of a resistive bridge array generally comprises a heating element (resistor) that is suspended over a temperature controlled substrate. Suspending the resistor keeps the cool substrate from restricting the emitter pixel's temperature range.

Although the resistor and support features for resistive bridge structures may be laid out in different formats, use different materials and have different drive circuitry, the overall structure, and architecture of the pixels are generally always the same. A key aspect of the resistive bridge pixel is that it is, as the name implies, a bridge structure. A resistor, absorber, encapsulant and leg are suspended above the substrate. This suspended bridge performs several functions, among them are thermal isolation from the cool substrate, and formation of a resonant optical cavity. Although resistive bridge structures can be made in many ways, there are several defining characteristics:

1) Thermal resistor suspended as a bridge over an air gap (also known as an optical cavity)
2) Interface to a silicon CMOS chip that provides power to the suspended resistor
3) Use of an absorber layer to increase optical fill factor
4) Use of leg structures to tune thermal conduction to the cooled silicon substrate Large Arrays Fabricating large arrays for imaging applications as well as scene projection is often limited by the yield of the large array. While there is a demand for large arrays, it is typically not economical to produce a large monolithic array, optical or mechanical. Tiling of smaller arrays can improve yield but, in the past, has left seams between the tiles that were comparable to the size of a pixel or larger and introduced unacceptable artifacts in both imaging and scene projection applications.

Bolometer

The techniques disclosed herein for tiling arrays of pixel elements may have applications beyond thermal emitters such as arrays of resistive pixel elements. For example, in creating tiled arrays of thermal detector pixel elements, such as microbolometers.

A bolometer is a device for measuring the power of incident electromagnetic radiation via the heating of a material with a temperature-dependent electrical resistance. A bolometer consists of an absorptive element, such as a thin layer of metal, connected to a thermal reservoir (a body of constant temperature) through a thermal link. The result is that any radiation impinging on the absorptive element raises its temperature above that of the reservoir—the greater the absorbed power, the higher the temperature. A microbolometer is a specific type of bolometer which may be used as a detector in a thermal camera. Infrared radiation strikes the detector material, heating it, and thus changing its electrical resistance. This resistance change is measured and processed into temperatures which can be used to create an image. Unlike other types of infrared detecting equipment, microbolometers do not require cooling.

Through Silicon Vias

A through-silicon via (TSV) is a vertical electrical connection (via)(Vertical Interconnect Access) passing completely through a silicon wafer or die. TSVs are a high performance technique used to create 3D packages and 3D integrated circuits, compared to alternatives such as package-on-package, because the density of the vias is substantially higher, and because the length of the connections is shorter. See, for example, *A Study of Through-Silicon-Via Impact on the 3D Stacked IC Layout*, Kim et al., ICCAD '09, Nov. 2-5, 2009, incorporated by reference herein as an example of making connections through a semiconductor chip. See also *Fabrication and characterization of metal-to-metal interconnect structures for 3-D integration,* Huffman et al., © 2009, IOP Publishing Ltd and SISSA, incorporated by reference herein.

Some Prior Art

The following patents and publications are incorporated in their entirety by reference herein.

U.S. Pat. No. 5,600,148 discloses low power infrared scene projector array and method of manufacture. The array combines a two-tier architecture created with special processing whereby each pixel member resides on an elevated platform directly over discrete pixel control electronics and electrically conducting traces couple a plurality of pixels so that they can be controlled to project thermal images at equal to or faster than video frame rates. Microlens assemblies coupled to each discrete pixel improves the thermal efficiency of the array for certain applications. In the method of fabrication, a semiconductor microbridge-type structure obtains with the use of sacrificial layers under deposited pixel members in a compact array so that the pixel electronics reside beneath their associated pixel and the array electronics inhabit the same chip as the array thereby improving fill factor and time constant of the resulting array.

U.S. Pat. No. 7,439,513 discloses fast microbolometer pixels with integrated micro-optical focusing elements. Each microbolometer pixel includes a focusing element located between the pixel body and a substrate, this focusing element preferably sending radiation back towards the central portion of the microbolometer. There is also provided a microbolometer array having a plurality of such microbolometer pixels.

*Characterization of the Dynamic Infrared Scene Projector (DIRSP) Engineering Grade Array (EGA)*, Manzardo et al., SPIE Vol 3697, April 1999, incorporated by reference herein, discloses a 672×544 format suspended membrane microresistor emitter array. Underlying CMOS electronics for the array contain addressing decoder and MUX electronics, as well as integrated sample and hold FET electronics. The DIRSP array is designed for either 32 or 64 parallel analog channel input operation.

SUMMARY

It is an object of the invention(s) to provide improved techniques for tiling sub-arrays of pixel elements to implement larger arrays, such as megapixel arrays. For example, the techniques disclosed herein address avoiding or circumventing problems associated with the seams between tiles which may include (i) artifacts of the seams manifesting themselves in the projected image, and (ii) damage to edge pixels in the sub-arrays (tiles, chips) due to manufacturing processes. Additionally, the techniques disclosed herein may eliminate the complexity associated with some prior art techniques of overcoming the seam problem.

As used herein, a pixel element may comprise an electrically active area or portion (such as a post, trace or resistor in a microbolometer or emitter array or contact points, traces or gates in the sensor layer of a quantum photon detector), and an optically active area or portion (such as the absorber portion of a microbolometer or emitter array or the photoelectron generating area of a quantum photon detector). In some cases, depending upon context, the term "active area" may be used to refer to either one of or both of the electrically and optically active areas. Generally, in addition to the active area, there is unit cell circuitry is associated with the pixel element for operating the pixel element, and is generally disposed below the active area of the pixel element. The unit cell circuitry may comprise a read-out integrated circuit (ROIC) or read-in integrated circuit (RIIC), but other arrangements of unit cell circuitry may be used.

Sub-arrays such as monolithic tiles having pixel elements may be arranged on a routing layer or carrier to form a larger tiled array. Through-chip vias or the like to the backside of the chip may be used for connecting with the pixel elements, or with or the unit cell circuitry of a detector or emitter pixel. Edge features of the tiles may provide for physical alignment, mechanical attachment and chip-to-chip communication. Edge damage tolerance with minimal loss of function may be achieved by moving unit cell circuitry and the electrically active portions of a pixel element away from the tile edge(s) while leaving the optically active portion closer to the edge(s) if minor damage will not cause a complete failure of the pixel. The pixel elements may be thermal emitter elements for IR image projectors, thermal detector elements for microbolometers, LED-based emitters, or quantum photon detectors such as those found in visible, infrared and ultraviolet FPAs (focal plane arrays), and the like. Various architectures are disclosed.

The techniques disclosed herein may be useful for producing a microbolometer array for imaging, for producing a resistive array for scene projection, and may also be applicable to UV cameras using CCD (charge-coupled device), DI (direct injection), CTIA (Capacitive Transimpedence Amplifiers) or other unit cell architectures. Cameras can have direct or indirect gap semiconductor detector materials, have quantum well detectors or have MEMS detectors. Scene projection technologies for which the techniques disclosed herein may be applicable may include visible, IR and UV projectors. Projectors may have current mirror or other unit cell architectures and have resistive array emitters, LED emitters, a reflective MEMS structure or may have a liquid crystal based WA.

According to the invention, generally, small arrays (which may be referred to as tiles, chips, or sub-arrays) of pixel elements may be fabricated with their unit cell circuitry below the active area and the majority of connections (including 50%, more than 50%, 75% up to 100% of the connections) may be located on the surface of the chip opposite the active area by vertical vias which may for example be through silicon vias (TSVs). Small sub-arrays may be precision diced to within a fraction of a pixel pitch from the edge of the active portion of the sub-array.

These small sub-arrays may then be precision aligned on a routing layer that connects the sub-array data and power from the back of the small sub-arrays to connectors outside of the active area of the tiled array. The routing layer may be passive (routing only) or may contain active circuitry.

Some damage to the edge of a sub-array tile (chip) is inevitable (unavoidable) as a result of manufacturing process (cutting, dicing, etc.). A tile may comprise active area and control circuitry. Either or both of these may be modified to avoid problems from edge damage. Some techniques disclosed herein address making the tiles less sensitive to such edge damage, and may include performing one or more of . . .

making all of the unit cells slightly smaller
  offsetting unit cells at the edge(s) of the tile, away from the edge(s) (towards the center)
  making the unit cells near the edges smaller than those in the center so they can be located away from the edge(s).

It should be understood that a corner pixel (or unit cell) is an edge pixel that lies at the periphery of the tile sub-array, and has two of its (four) edges susceptible to damage. Corner pixels (or unit cells) may be treated differently than edge pixels which are not corner pixels.

Techniques are disclosed for implementing a sub-array tile with different pixel designs for edge pixels (pixels which are disposed at an edge of the sub-array tile) having only one side susceptible to edge damage, corner pixels (pixels which are disposed at a corner of the sub-array tile) having two sides susceptible to edge damage and center pixels which are those pixels which are not disposed along a tile edge.

Some prior art describes tiling on two sides, such as by forming a 2×2 array of tiles (four total), each rotated 90 degrees with respect to the others. The techniques disclosed herein allow for tiling on all four sides of a (square) chip, thereby allowing arbitrarily large arrays to be manufactured from smaller tiles.

According to some embodiments (examples) of the invention, a method of fabricating and assembling a plurality of tiles having pixel elements to form a large array may comprise: providing physical alignment features on side edges of the tiles; wherein the physical alignment features on a side edge of a given tile mate with the physical alignment features on a side edge of an adjacent tile in the array; and may further comprise: fabricating individual tiles by hybridizing an array of pixel elements onto control circuitry. The physical alignment features may comprise bump features protruding from side edges of the tiles and corresponding recess features extending into side edges of the tiles; Back surface connections may be provided on the tiles, the tiles may be mounted on a routing layer having front surface connections, and the back surface connections may be connected to the front surface connections using through chip routing techniques wherein vias are disposed below the pixel elements. The tiles may be mounted to the routing layer with a sub-pixel size to zero gap at seams between adjacent tiles. A plurality of tiles may be tiled into a plurality of the tiles into a larger array. The pixel elements may comprise radiating or detecting elements, and associated control circuitry.

According to some embodiments (examples) of the invention, a hybridized array of pixels may comprise: an array of pixel elements on a first substrate hybridized with a corresponding array of control circuitry on a second substrate; wherein a portion of the pixels disposed at an edge of the array are smaller than the pixels at an interior of the array. Contacts associated with the pixels at the edge of the array may be smaller, and spaced farther from an edge of the array than contacts associated with the pixels at the interior of the array. The pixels may comprise thermal or solid state emitters or detectors. The hybridized array (or sub-array, or tile) may have a convex polygonal shape selected from the group consisting of triangular, square, rectangular, parallelogram, trapezoidal, and hexagonal.

According to some embodiments (examples) of the invention, a hybridized array of semiconductor elements and control circuitry may comprise: a first electronic component comprising a plurality of individual semiconductor elements disposed on a first substrate; a first set of bump contacts disposed on the individual semiconductor elements; a second electronic component comprising control circuitry disposed on a second substrate for operating the semiconductor elements; and a second set of bump contacts disposed on the second substrate; wherein the first and second substrates are joined, face-to-face, and the first set of bump contacts is connected with the second set of bump contacts, resulting in a hybridized array of semiconductor elements and control circuitry extending over an area which is smaller than an overall surface area of the first and second substrates and which is singulated from the first and second substrates. The semiconductor elements may comprise emitters or detectors; and the control circuitry may comprise read in circuitry (RIIC) or read out circuitry (ROIC). The hybridized array may further comprise: alignment features extending from edges of the hybridized array for facilitating tiling a plurality of hybridized arrays into a larger array. A plurality of tiled hybridized arrays may be disposed on a routing layer. The first and second substrates may comprise semiconductor wafers.

According to some embodiments (examples) of the invention, a method of making a hybridized array of semiconductor elements and control circuitry may comprise: providing a plurality of individual semiconductor elements on a first substrate; providing a first set of bump contacts on the individual semiconductor elements; providing control circuitry on a second substrate for operating the semiconductor elements; providing a second set of bump contacts on the second substrate; joining the first and second substrates, face-to-face, and connecting the first set of bump contacts with the second set of bump contacts; and after joining the first and second substrates, singulating a resulting hybridized array of semiconductor elements and control circuitry from the first and second substrates. The semiconductor elements may comprise emitters or detectors; and the control circuitry may comprise read in circuitry (RIIC) or read out circuitry (ROIC). The hybridized array may extend over an area which is smaller than an overall surface area of the first and second substrates. Singulating may comprise removing an outer area of the first and second substrates. Alignment/attachment features may be provided on the second substrate; and singulating may reveal the alignment/attachment features.

In their various embodiments, the invention(s) described herein may relate to industrial and commercial industries, such as thermal radiation emitters or detectors.

Other objects, features and advantages of the invention(s) may become apparent from the following description(s) thereof.

BRIEF DESCRIPTION OF THE DRAWINGS

Reference will be made in detail to embodiments of the disclosure, non-limiting examples of which may be illustrated in the accompanying drawing figures (FIGs). The figures may be in the form of diagrams. Some elements in the figures may be exaggerated, others may be omitted, for illustrative clarity. Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein.

FIG. 2A is a plan view of a sub-array tile showing the back of the tile including pads for connection to the routing layer, according to some embodiments of the invention. FIG. 2B is a side (edge) view of the tile shown in FIG. 2. FIG. 2C is a plan view of the front of the sub-array tile showing the active elements such as emitter pixels or microbolometer pixels, on the front of the tile.

FIG. 11A is a plan view of two hybridized arrays joined (tiled) with one another.

FIG. 11B is a cross-sectional view of the two joined arrays of FIG. 11A, taken on a line 11A-11A through FIG. 11A.

DETAILED DESCRIPTION

Various embodiments will be described to illustrate teachings of the invention(s), and should be construed as illustrative rather than limiting. Any dimensions and materials or processes set forth herein should be considered to be approximate and exemplary, unless otherwise indicated.

The present disclosure is directed to techniques for fabricating large arrays of pixels from tiling smaller arrays (sub-arrays or tiles), where there is a sub-pixel (less than the pitch of a pixel) to zero gap at the seams between tiles. The basic concept is to route all I/O (power and data) through the back of the array so that the tiles can be placed edge-to-edge on all sides. The small arrays can then be arranged into a larger M×N array. This technique is applicable to both imaging systems as well as to projection systems.

In general, infrared (IR) radiation may have a range of wavelengths of 0.8-20 μm or larger though the most common wavelengths uses for thermal imagery are 3-5 um (commonly known as the mid-wave IR band or MWIR) and 8-12 um (commonly known as the long-wave IR band or LWIR). Such large wavelengths, compared to visible light (0.4-0.7 μm), may require larger detector and emitter pixels for efficient production and detection of IR radiation. Current IR detector arrays range in pixel size from 12 to 25 μm and emitter arrays range from 25 to 50 μm. It is in part due to this relatively large wavelength that tiling of sub-arrays is beneficial to implement larger overall arrays, such as megapixel arrays, which would be quite large. For visible light emitters and detectors, pixels may be 2-3 μm, generally making tiling unnecessary to implement megapixel arrays. (A million visible light pixel elements may occupy a much smaller area than a comparable megapixel array of IR pixel elements.)

In the main hereinafter, arrays and sub-arrays of pixel elements which are resistive bridge type thermal emitters may be discussed, as exemplary of techniques for integrating a number of tiles of pixel elements into a larger array, including but not limited to resistive bridge type thermal emitter pixel elements and thermal detector pixel elements such as may be used in microbolometers.

Forming a Large Array by Tiling Smaller Sub-Arrays

Figure 1:
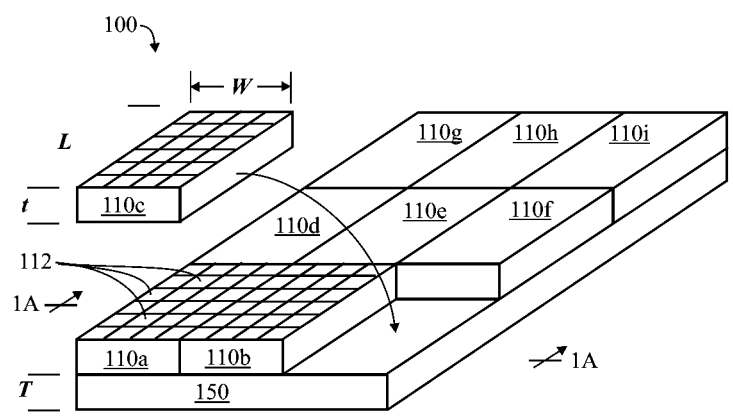
FIG. 1 is a perspective view showing a plurality of sub-arrays (tiles) arranged in a larger M×N "tiled" array, according to some embodiments of the invention.
Figure 1A:
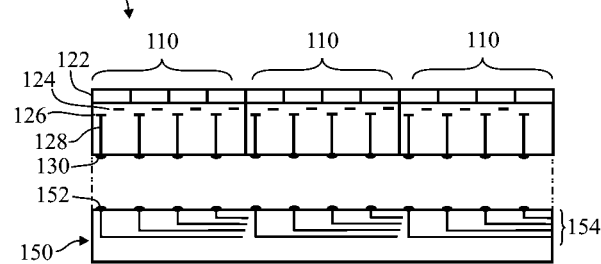
FIG. 1A is a cross-sectional view of a portion of the tiled array shown in FIG. 1.

FIGS. 1, 1A illustrate the basic concept of forming a tiled array 100 having a plurality of sub-arrays 110 (or small arrays, or tiles, or chips). Each tile 110 may be a semiconductor chip, comprising a plurality (such as an array) of pixel elements 112. The pixel elements 112 may be radiating elements or emitters (such as resistive bridge pixels for a thermal projector) or detecting elements (such as detector pixels for a microbolometer). In the main hereinafter, resistive bridge emitter pixels may be described as representative of pixel elements which are radiating elements, detecting elements, or the like. The various techniques disclosed herein are not limited to any particular kind of pixel element.

All of the sub-arrays (tiles) 110 in the larger array 100 may be substantially identical with one another. Alternatively, different sub-arrays (tiles) 110 may be used in different areas of the larger array 100, for example selected sub-arrays 110 having a faster readout or higher resolution than the others. And, as described below, (for example with respect to FIGS. 7A,B,C) different pixel elements within a given tile may be designed differently from one another, with regard to their active areas (electrical portion and optical portion) and unit cell circuitry, and also oriented differently, depending on their location in the tile, such as at an edge, a corner or interior the tile.

Although only a limited number (nine, in a 3×3 tiled array) of sub-arrays (tiles, chips) 110a-110i (which may individually or collectively be referred to simply as "110") are shown, the overall larger, tiled array 100 may comprise M×N (rows×columns) of tiles 110, such as at least 2 rows (M) and 2 columns (N), up to 8 rows (M) and 8 columns (N), or more. The invention is not limited to any specific number of tiles 110, and the number of rows and columns do not need to equal one another, for example 4 rows (M) and 8 columns (N) is acceptable.

A representative individual tile 110c is illustrated separate from the array 100 and may have two sets of parallel, opposite sides (such as, but not limited to rectangular), and may have the following exemplary dimensions: thickness t=~1 mm; width W=~2.5 cm; length L=~2.5 cm.

The tiles 110 may be symmetric or asymmetric, and may typically be polygonal in shape, such as triangular, square, rectangular, parallelogram or trapezoidal, hexagonal, and the like, and typically all of the tiles will be the same shape as one another, although this concept can be extended to non-uniform tiling strategies. Two (or more) different tile shapes (or different orientations of the same shape, such as trapezoids having alternating up-down-up-down orientations) may be used to cover (populate, tile, tessellate) the overall larger array in a repeating pattern. In the main, hereinafter, populating a large array with smaller arrays which are square tiles will be discussed as representative of the techniques disclosed herein.

Each tile 110 may have a plurality of pixel elements 112 formed thereupon, for example in an array of "m" rows and "n" columns, such as but not limited to 512 (m)×512 (n) pixel elements, 1024 (m)×1024 (n) pixel elements, etc. A given pixel element 112 may be a thermal or infrared (IR) radiating element or emitter such as the resistive thermal radiation emitters disclosed in U.S. Pat. No. 5,600,148. A typical size for an individual pixel element 112 may be approximately 50 μm×50 μm (2.5 cm/512=0.05 mm=50 μm). In FIG. 1, individual pixel elements 112 are shown only on some of the tiles, for illustrative clarity, and they are not individually numbered. And, only a few of what may be many pixel elements 112 are shown.

A plurality of tiles 110 may be arranged (placed, mounted on) a routing layer 150, closely abutting one another, edge-to-edge (side-to-side), so that there is a sub-pixel size gap (such as <50 μm) between adjacent tiles 110. It is desirable to minimize the gaps between adjacent tiles, such as to ¼ of a pixel width, preferably less than ⅒ of a pixel width, for example, less than 5 μm. It may be generally desirable to match (as closely as possible) the coefficient of thermal expansion (CTE) of the routing layer 150 with the CTE of the tiles 110, then attach the two with a compliant but conductive layer of a material such as indium.

As best viewed in FIG. 1A, a given tile 110 may comprise a plurality of each of . . .
- 122 active areas (represented by rectangles) on the top side (front surface) of the tile,
  - for thermal emitters, the active areas may comprise resistive bridges
- 124 unit cell circuitry (represented by dashes "-")
  - the "unit cell" is the electrical circuit portion (analog and or digital circuitry) of a pixel element (PE) comprising active area 122 and unit cell circuitry 124. Some circuitry 124 may be common to several pixel elements.
- 126 control circuitry (represented by dashes "-") for controlling operation of the various pixel elements
  - the control circuitry 126 may comprise power planes, clock lines, etc.
- 128 through-chip routing from the control circuitry to back (bottom) side connections 130
  - this may include TSVs or other through chip routing techniques
- 130 bottom side (back surface) connections (such as ball bumps)
  - there may be fewer than one, one, or more than one bottom surface connections per pixel element 112 (122+124)

The routing layer 150 may comprise
- top side (front surface) connections 152 corresponding in both number and layout to the bottom side (back surface) connections 130
- conductive paths or traces (routes, interconnects) 154 extending in and through the routing layer 150, extending to an external connector (not shown) or the like The I/O (input/output) from each tile 110 may pass through the routing layer 150 which carries signals between the chips (tiles) as well as carrying power and data between the chips and the rest of the system (not shown), for example a thermal projector system (not shown).

The routing layer 150 can be a separate (from the rest of the circuitry) entity such as a large silicon wafer. Alternatively, the routing layer may be integrated into another structure, such as a multi-layer ceramic chip carrier (MLCC). The routing layer can be entirely passive (only interconnects), or it may include active circuitry (not shown).

Alignment Features and Edge Contacts

Alignment features as well as inter-chip connections can be integrated into the tiles (chips), such as on the side edge(s) and bottom surface of the chips, so as not to interfere with or compromise the top surface of the chip which may be dedicated to active area (pixel elements), while maintaining the desired minimal (sub-pixel sized) gap objective.

FIGS. 2A,B,C illustrate an exemplary single tile (chip, sub-array) 210 comprising an 8×8 sub-array of pixel elements 212. A given tile 210 may comprise a square shaped chip having four side edges 202a-d (which may collectively or individually be referred to as "202"), and may contain many more, such as 512×512 (or more) pixel elements 212, only 8×8 pixel elements 212 being illustrated in these figures, for illustrative clarity.

FIG. 2A is a plan view of the back side of the sub-array (tile, chip) 210, generally showing the back surface of the tile 210 including pads 214 (compare 130) for connection to the routing layer (150). There may be fewer pads (bottom connections) 214 than pixel elements 212. FIG. 2C is a plan view of the front surface of the sub-array tile showing the active elements such as emitter pixels or microbolometer pixels. FIG. 2B is a side view of a side edge of the tile 210.

One or more interlocking (mating, self-aligning) alignment features may be incorporated on the tiles (chips) 210 for sub-pixel alignment accuracy. For example, the alignment features may comprise bump features 204a-d (which may collectively or individually be referred to as "204") protruding from the respective side edges 202a-d of the chip 210, and corresponding recess features 206a-d (which may collectively or individually be referred to as "206") extending into the corresponding side edges 202a-d of the chip 210. Any suitable alignment features may be used to ensure good mechanical alignment and registration and/or mechanical attachment of the chips 210, which may need to be assembled with one another prior to being disposed on the routing layer (150). The alignment features of a given tile are designed to mate with the alignment features of an adjacent tile in the large array. For example, both of the mating features 204 and 206 could be bump features protruding from side edges of the tiles, alternating (interleaved or interdigitated) with each other to ensure good physical alignment between tiles.

Although the figures show only one bump 204 and one recess 206 per side, many more bumps and recesses may be incorporated on each side of the chip 210. The thickness of a given bump or recess (see FIG. 2B) may be a small fraction of the overall tile thickness.

The bumps 204 and recesses 206 may be precision formed, and when the tiles 200 are assembled with one another, a given bump 204 may fit snugly within a corresponding given recess 206 to ensure precise alignment of the tiles 200 with one another. For example, the bump 204a extending from the top edge 202a of a given tile will mate with the recess 206c extending into the bottom edge of a neighboring tile (in the overall larger array) which is arranged above the given tile, the bump 204b extending from the right edge 202b of the given tile will mate with the recess 206b extending into the left edge of a neighboring tile which is disposed to the right of the given tile, etc.

Solder or other connection method such as epoxy may be used make a robust mechanical joint between the tiles which are generally attached with one another prior to being placed on the routing layer or carrier. Optionally, an assembly jig may be used to temporarily keep the tiles aligned with one another for assembly to the routing layer or carrier. It is also possible that the tiles can be assembled one-by-one to the routing layer or carrier.

Although not shown, some implementations may incorporate alignment and/or attachment structures which encroach on the active portion of the array and cause the loss of some of the pixels along a tile edge. Depending on the application, this may be an acceptable loss.

Alignment features such as those used for "quilt packaging" may be incorporated into the tiles 210. See, for example, Quilt Packaging™—Ultrahigh Performance Chip-to-Chip Interconnects, Indiana Integrated Circuits LLC, incorporated by reference herein.

In addition to or in conjunction with the physical alignment features 204 and 206 described above, which are essentially and substantially "mechanical" in nature, edge features 208a-d (which may collectively or individually be referred to as "208") may be provided on respective edges 202a-d of the tile 210 for effecting electrical connections between neighboring/adjacent tiles. These electrical connection features 208 may comprise solder and, in combination with internal routing within the chips, may provide for propagating signals from chip-to-chip directly (bypassing the routing layer 150) such as for controlling rastering, enabling rows of chips or rows or pixel elements in sequence, and the like. The physical alignment features may include providing electrical connections between the tiles.

In FIG. 2B, the alignment features 204/206 and connection features 208 are illustrated as being disposed between the back and front surfaces of the tile 210. Either or both of the alignment features 204/206 and connection features 208 may be located elsewhere, such as at or towards the back surface (left, as viewed) or bottom edge (alternatively, at or towards the front surface/top edge) of the tile 210 while maintaining the ability to position the tiles with a gap of less than 1 pixel pitch (down to substantially) zero gap between adjacent tiles in the large array (100).

The following patents and publications, incorporated by reference herein, are illustrative of techniques which may be useful for implementing some of the edge features (204, 206, 208) described hereinabove . . .
US 2012/0133381; U.S. Pat. No. 7,923,845; U.S. Pat. No. 4,542,397
A novel method for nanoprecision alignment in wafer bonding applications, Jiang et al., Journal of Micromechanics and Microengineering, 17 (2007) S61-S67, IOP Publishing Ltd The edge features (204, 206, 208) and back surface connections 214 described above are generally implemented in a manner to maximize usable area on the front side of the tile for active area (pixel elements). It is within the scope of the invention that a small number of pixel elements along the edge(s) of the tile may be sacrificed to make room for implementing some of the edge features (204, 206, 208). For example, it may be acceptable to sacrifice 1 pixel element out of every 20 or more (such as 1 per hundred) to implement the edge features.

Sub-Array Architectures

Figure 3A:
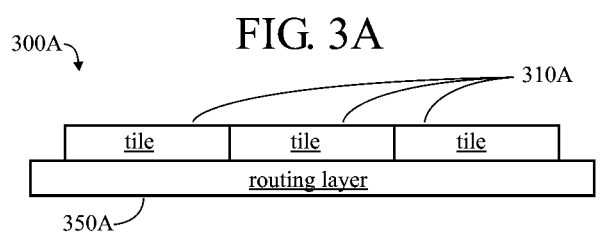
FIGS. 3A,B,C are cross-sectional views of some sub-array architectures, according to some embodiments of the invention.

FIGS. 3A,B,C illustrate some sub-array (tile) architectures 300A,B,C, according to some embodiments of the invention. In each of these, a plurality of sub-arrays (tiles) may be arranged on a routing layer 350A-C (compare 150), generally in the manner shown in FIGS. 1, 1A. In each of these representations, only three sub-arrays are shown, as representative, for illustrative clarity. Back surface connections (130, 214), edge features (204, 206, 208) and the like are omitted, for illustrative clarity.

FIG. 3A illustrates a plurality of sub-arrays (tiles) 310A disposed on a routing layer 350A. Each sub-array 310A has the requisite emitter (or detector) elements and associated circuitry for a plurality of pixel elements, in the manner of the single-chip tiles 110 described hereinabove. This is comparable to what was shown in FIG. 1A.

Figure 3B:
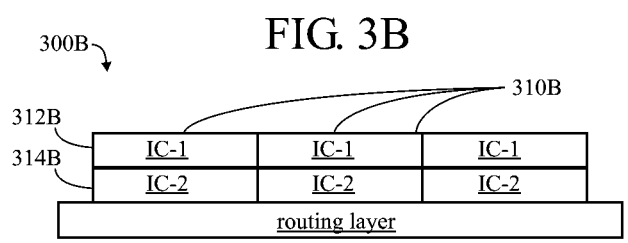

FIG. 3B illustrates a plurality of sub-arrays (tiles) 310B disposed on a routing layer 350B. The tiles 310B are "vertically integrated" in that each tile 310B may comprise a first component such as a integrated circuit ("IC-1") 312B that is primarily analog in nature (such as comprising the active arrays for a plurality of pixel elements, or analog portion of a detector array) disposed atop and connected with a second component such as an integrated circuit ("IC-2") 314B that is primarily digital in nature (such as comprising the unit cell circuitry for a plurality of pixel elements, or digital portion of a detector array). The ICs 314B may be connected with one another via the routing layer 350B.

Figure 3C:
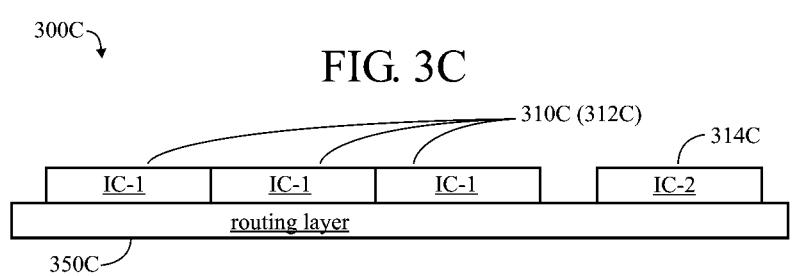

FIG. 3C illustrates a plurality of sub-arrays (tiles) 310C disposed on a routing layer 350C. Each sub-array 310C may comprise an integrated circuit (IC) component 312C ("IC-1") having limited functionality, such as comprising the requisite emitter (or detector) elements (such as active array and unit cell) disposed on and connected with the routing layer 350C. Further components (for example a digital-to-analog converter or analog-to-digital converter) 314C ("IC-2") having associated circuitry for a plurality of pixel elements may also be disposed on and connected with the routing layer 350C. A single IC 314C may be associated with all of the ICs 312C. Alternatively, each of a number of ICs 314C may be associated with a subset of all the ICs 312C. An example may be a RIIC with all the unit cell circuitry on the tiles 310C, but digital-to-analog converters and/or demultiplexing circuitry located off the tiles 310C (on IC-2). Features may be incorporated onto the back surfaces of the IC chips (312C) to allow for precise alignment and inter-chip connections without losing active pixels or requiring a larger gap between tiles (sub-arrays).

Techniques for Reducing Effects of Edge Damage

A large array may comprise many tiles arranged abutting each other in an array, each tile having a plurality of pixel elements, as described above. The tiles may be individual IC chips that are singulated (diced, or otherwise cut or separated) from a larger wafer. Some chips will inevitably be defective. Others may sustain damage to pixel elements at their edge(s) resulting from the singulation process.

It is generally desirable that a large array assembled from several tiles (sub-arrays) should not exhibit discontinuities, particularly patterns of discontinuities when looking at the overall pattern of pixel elements. In other words, a large tiled array should ideally behave like a large monolithic array. The most obvious source(s) of undesirable discontinuities in the overall pattern of pixel elements would be the gap between tiles and misalignments of the tiles. Some techniques have been discussed herein for minimizing these assembly-oriented problems.

Generally, in order to minimize the effects of gaps between tiles (chips), the chips should be diced as close to the edge of the pixel elements (active pixels) as possible.

However, cutting the chip so near the active circuitry can lead to nonfunctional pixels along the tile edges. Small dicing errors can easily lead to dead pixels. This problem may be referred to as "edge pixel damage".

Some techniques will now be described for minimizing the potential for small dicing errors resulting in damage to pixel elements, particularly pixel elements at edges of the tiles (chips) which have been processed (cut, diced) from a larger substrate (wafer). This may result in more usable chips (tiles) per wafer and/or reducing the edge pixel mortality rate to a more conventional and uniformly distributed rate such as may be associated with material defects in any of the pixel elements.

Moving Unit Cell Circuitry Away from the Tile Edges

One technique for minimizing edge pixel damage is to design the read-out integrated circuit (ROIC) or read-in integrated circuit (RIIC) pixel unit cells (individually and collectively referred to as "unit cell circuitry") to be measurably smaller than the pixel pitch. Generally, there is one unit cell circuit per pixel element. While most of the sub-array (tile) would have the unit cell circuitry centered in the pixel, the unit cell circuitry in the edge and corner pixels (a corner pixel is an edge pixel at two intersecting edges) may be biased (positioned) towards the center of the sub-array. In this way, the active circuitry is kept away from the edge(s) of the tile, and is thus less susceptible to failure if the tile edges gets damaged during processing. In the following figures, some examples may be shown of locating the unit cell circuitry for pixel elements disposed at an edge of the tile susceptible to damage away from the edge of the tile.

Figure 4:
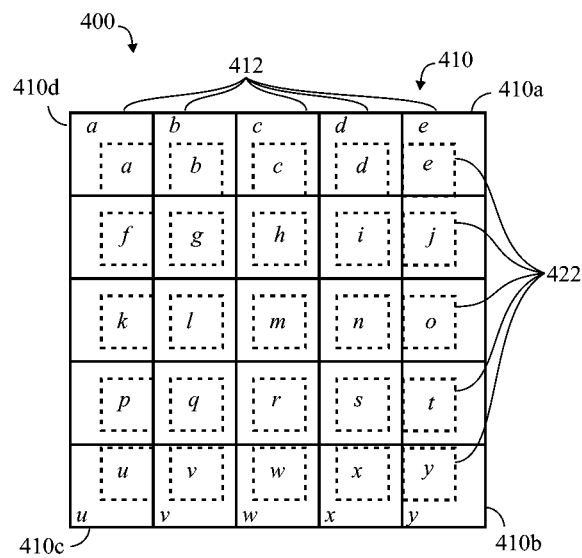
FIG. 4 is a plan view of a 5×5 sub-array of unit cells, according to some embodiments of the invention.

FIG. 4 illustrates a design for a tile 400 illustrating a technique (400) for reducing damage to unit cell circuitry of edge pixels, in the context of an exemplary sub-array tile 410 comprising a 5×5 sub-array of pixel elements 412. The tile 400 may comprise a square shaped chip having four side edges 410a-d (which may collectively or individually be referred to as "410"), and may contain many more, such as 512×512 (or more) pixel elements, only 5×5 pixel elements being illustrated in this figure, for illustrative clarity.

The top left pixel element 412 may be referred to as "a", and the bottom right pixel element 412 may be referred to as "y", the other pixel elements 412 in the array being referred to as "b"-"x", in sequential order across the top row, from left to right, then across the next lower row from left to right, and so forth, only some of the reference numerals actually appearing in the figure, for illustrative clarity.

Sub-array unit cell circuitry 422 is shown for each of the pixel elements 412. In this example, there are twenty five (25) unit cell circuits 422 arranged in a 5×5 (m×n) array, each of the twenty five (25) unit cell circuits 422 being associated with a corresponding one of the twenty five (25) pixel elements 412.

The top left unit cell circuit 422 may be referred to as "a", and the bottom right unit cell circuit 422 may be referred to as "y", the other unit circuits 422 in the array being referred to as "b"-"x", in sequential order across the top row, from left to right, then across the next lower row from left to right, and so forth, only some of the reference numerals actually appearing in the figure, for illustrative clarity.

Generally, in this technique 400 the unit cells 422 may each be located under the active area for a given pixel element 412, may be somewhat smaller than the active area of the respective pixel element 412, and may be the same size as one another (the pixel elements may also be the same size as one another). In this technique, the unit cells 422 associated with edge pixel elements 412 are biased (positioned, located) away from the edge, to avoid edge pixel damage.

The pixel elements 412 are shown with solid lines, the unit cell circuits 422 are shown with dashed lines, and may be analog and/or digital circuitry located approximately underneath the overlying emitter (or detector) elements, such as was shown in FIG. 1A.

All of the pixel elements 412 may be square and have substantially the same size as one another, such as 50 µm×50 µm. Each of the unit cell circuits 422 may also be square and have substantially the same size as one another, such as 40 µm×40 µm. Generally, the unit cell circuitry 422 may be at least 1% smaller, including at least 2% smaller, at least 5% smaller, at least 10% smaller, at least 20% smaller, at least 30% smaller, at least 40% smaller, and at least 50% smaller than the pixel element 412 with which it is associated.

The array of unit cell circuitry 422 may be similar in shape with but smaller than the array of corresponding pixel elements 412. Unit cell circuits 422 lying along edges 410a,b,c,d of the tile 410 are displaced away from the corresponding edges, for example . . .

the unit cell circuit 422a may be displaced to the right away from the left edge 410d of the tile 410, and downward away from the top edge 410a of the tile 410 the unit cell circuits 422b,c,d may be displaced downward away from the top edge 410a of the tile 410 the unit cell circuit 422e may be displaced to the left away from the right edge 410b of the tile 410, and downward away from the top edge 410a of the tile 410 the unit cell circuits 422f,k,p may be displaced to the right away from the left edge 410d of the tile 410 the unit cell circuit 422u may be displaced to the right away from the left edge 410d of the tile 410, and upward away from the bottom edge 410c of the tile 410 the unit cell circuits 422j,o,t may be displaced to the left away from the right edge 410b of the tile 410 the unit cell circuit 422y may be displaced the left away from the right edge 410b of the tile 410, and upward away from the bottom edge 410c of the tile 410e the unit cells 422v,w,x may be displaced upward away from the bottom edge 410c of the tile 410e The technique 400 may be summarized by stating that the unit cell circuits 422 are each smaller in area than the respective pixel elements 412 with which they are associated, but each unit cell circuit is generally directly under the active area of for the pixel element 412. In edge pixels, edge unit cell circuits 422 (a,b,c,d,e,f,k,p,u,j,o,t,y,v,w,x) are biased away from the edges of the tile to reduce the risk of damage during edge processing.

The ROIC or RIIC array unit cell circuits may be designed to have a slightly smaller size and/or pitch than the active elements of the array (detectors or emitters), thus making the overall unit cell circuitry slightly smaller than the active area. If necessary, an additional layer may then be then added to route from one pitch to the other, joining the unit cell circuitry to the detector pixels or emitter pixels. This technique of routing from one pitch to the other will be shown in the next example (FIG. 5A).

Figure 5:
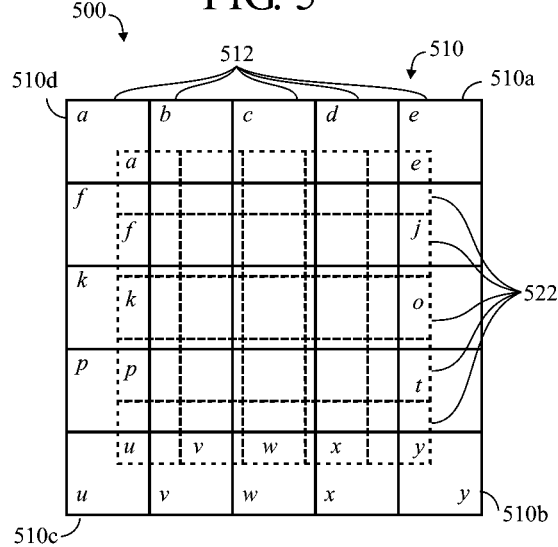
FIG. 5 is a plan view of a 5×5 sub-array of unit cells, according to some embodiments of the invention.
Figure 5A:
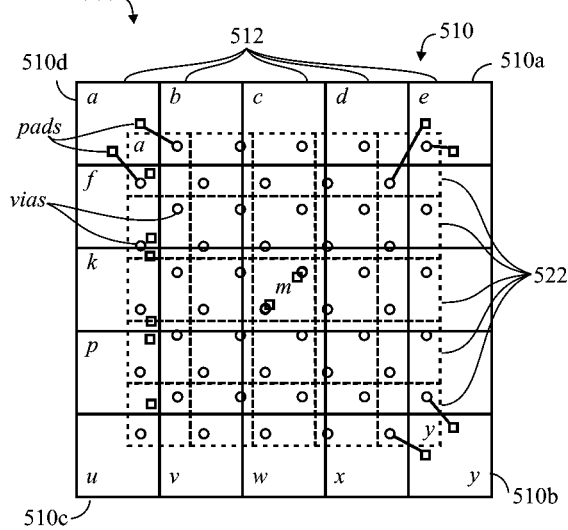
FIG. 5A is a cross-section of the tile of FIG. 5.

FIG. 5 illustrates another example of a tile 500 illustrating a technique (500) for reducing damage to unit cell circuitry of edge pixels, in the context of an exemplary sub-array tile 510 comprising a 5×5 sub-array of pixel elements 512. The tile 500 may comprise a square shaped chip having four side edges 510a-d (which may collectively or individually be referred to as "410"), and may contain many more, such as 512×512 (or more) pixel elements, only 5×5 pixel elements being illustrated in this figure, for illustrative clarity.

The technique 500 of FIG. 5 is similar to the technique of FIG. 4 in that the unit cell circuitry 522 is designed to be smaller than the pixel element 512. As in the previous example (FIG. 4), a 5×5 array of pixel elements (individually and collectively referred to as "512") is illustrated, and the individual pixel elements are labeled "a" (top left pixel element 512) through "y" (bottom right pixel element 512). And, a 5×5 array of unit cell circuits (individually and collectively referred to as "522") is illustrated, and the individual unit cell circuits are labeled "a" (top left unit cell circuit 522) through "y" (bottom right unit cell circuit 522).

In a manner similar to the technique of FIG. 4, in this technique 500 the unit cell circuits 522 are designed to be uniformly smaller than the pixel elements, and unit cell circuits at the edges of the tile are displaced away from the edges 510a-d of the tile 510 to avoid problems associated with edge pixel damage.

In contrast with the technique of FIG. 4, in this technique 500 the unit cell circuits 522 are not only designed to be smaller, and moved away from the edges of the tile, but they are also "packed" more closely with one another. In other words, rather than having leftover space between adjacent unit cells circuits 422 (which is evident in FIG. 4), the unit cell circuits 522 are moved even further towards the center of the tile 510, resulting in their being relocated even further away from the edges 510a-d of the tile 510. As is evident in FIG. 5, this may result in several of the unit cells circuits 512 being located under two or more adjacent pixel elements 512. For example . . .

the unit cell circuit 522a which is moved away from the top edge 502a and left edge 502d of the tile 510 underlies the active area for the pixel elements 512a, 512b, 512f and 512g.

the unit cell circuit 522b which is moved away from the top edge 502a of the tile 510 underlies the active area for the pixel elements 512b, 512c, 512g and 512h.

and so forth, as shown in FIG. 5.

The center of the array of unit cell circuitry 522 may be coincident with the center of the array of corresponding pixel elements 512, even though the array of unit cell circuitry is smaller. Most of the unit cell circuits 522 are offset from their respective pixel elements 512, but it may be noted that the middle (central) unit cell circuit 522 ("m") may be located directly under the active area of the pixel element ("m"), the array of unit cell circuits 522 being centered with the array of pixel elements 512.

The technique 500 may be summarized by stating that the unit cell circuits 522 are each smaller in area than the respective pixel elements 512 with which they are associated, but edge unit cell circuits 522 (a,b,c,d,e,f,k,p,u,j,o,t,y,v,w,x) are biased away from the edges of the tile and towards the center of the tile, resulting in some unit cell circuits 522 being under active areas for two or more adjacent pixel elements 512.

In this technique 500, the pitch of the unit cell circuitry 522 which is all biased towards the center of the tile is less than (rather than substantially equal to) the pitch of the pixel elements 512, and as mentioned above, an additional layer may then be then added to route from one pitch (of the pixel elements 512) to the other (of the unit cell circuitry 522), joining the unit cell circuitry to the detector pixels or emitter pixels. This technique of routing from one pitch to the other (sometimes referred to as "space transformation") will be shown in and described with respect to the following figure (FIG. 5A). More generally, it is evident in FIGS. 5,5A that the unit cell circuitry 522 has been shifted, and is not aligned with the pixel elements (512). Contrast FIG. 4 where the unit cell circuitry 422 is aligned with the pixel elements 412.

Figure 7A:
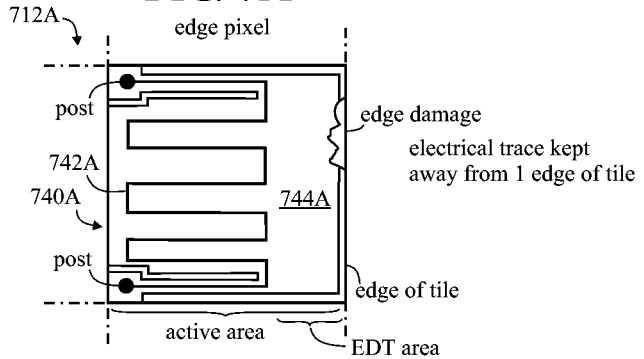
FIGS. 7A,B,C are plan views of pixel elements, according to some embodiments of the invention.
Figure 7B:
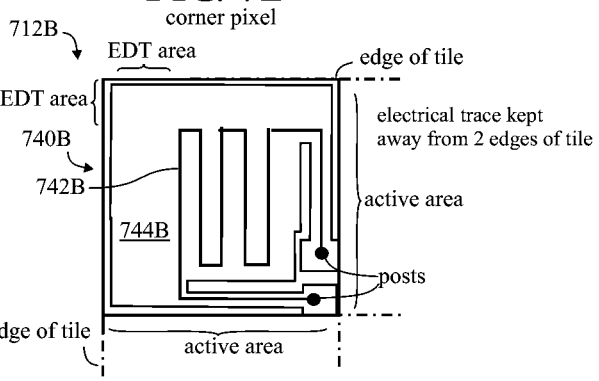
Figure 7C:
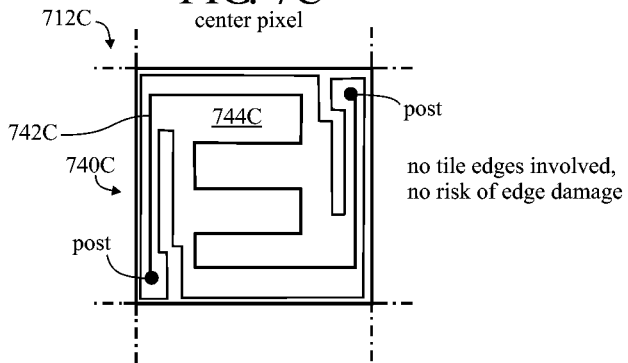

FIG. 5A shows an example of routing between the layers, along with pad locations shifted away from the edges. In this figure, the small squares, two per pixel element 512, represent pads for supporting (if necessary) and contacting the active elements (emitters or detectors), such as resistive bridges which have two terminals (ends). Many of the pads have been omitted, for illustrative clarity.

the small circles, two per unit cell circuit 522, represent connections, such as vias or contact points, in the unit cell circuitry. Each two (pair of) vias are shown as being in diagonally opposed corners in a respective unit cell circuit 522.

the lines joining the small squares to small circles represent interconnect (routing) traces, which may be implemented in a separate layer. Only some lines (connecting pads from pixel element 512a,e,y to vias for unit cell circuits 522a,e,y) are shown, for illustrative clarity.

as shown, there may be two pads (small squares) per pixel element 512, two vias per unit cell circuit 522, and one trace connecting each pad with a respective via Generally, the two vias for the unit cell circuitry 522 may all be located at opposite two corners of the respective unit cell circuit 522. In other words, all the unit cell circuits may be the same as one another. However, it may be advantageous to design the active element and pads differently for various subsets of pixel elements 512, such as for edge pixels, corner pixels (a subset of edge pixels) and interior pixels (those pixels which are not edge pixels). FIGS. 7A, 7B, 7C show examples of edge, corner, and interior (or center) pixels, respectively.

Figure 6:
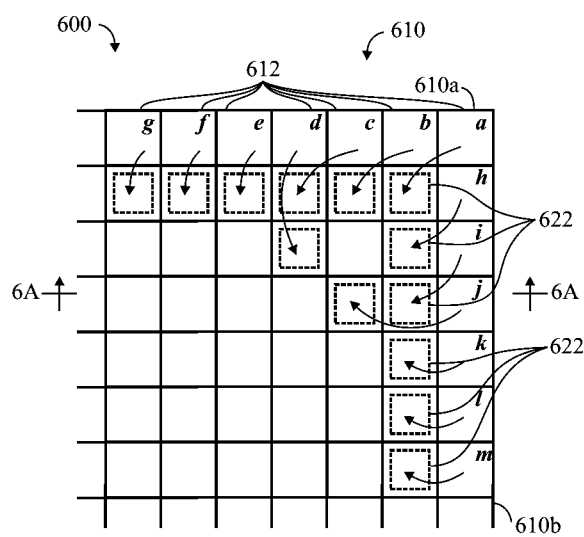
FIG. 6 is a plan view of a 8×8 corner portion of a sub-array of unit cells, according to some embodiments of the invention.
Figure 6A:
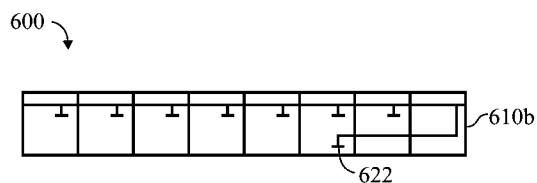
FIG. 6A is a cross-section of the tile of FIG. 6.

FIGS. 6, 6A illustrates another example of a design for a tile 600 illustrating a technique for minimizing edge pixel damage. In this technique (600), the unit cell circuitry (collectively "622") is made smaller and is maintained the same as the pitch as the active areas of the pixel elements (collectively "612). This much is similar to the technique 400 of FIG. 4.

Expanding upon the notion of moving the unit cell circuits 622 inward, away from the edges 610a and 610b (only two edges illustrated) of the tile 610, such as was described with respect to the technique 500 of FIG. 5, in this example the unit cell circuits 522 for edge pixel elements 512 may be moved even further away from the edges of the tile until they are disposed under an entirely different active area, with which they are not associated. The curved arrows extending from the pixel elements 512g,f,e,d,c,b,a,h,I,j,k,l,m indicate this relocation. In FIG. 6A it can be observed that the unit cell circuit 622 for pixel element 612j has been moved away from the edge pixel element with which it is associated to under another pixel which is away from the edge 610b of the tile 600.

In order to implement this technique, additional routing layers may be required. The edge unit cell circuitry may be moved inward from the edge pixels, in layers of the tile (IC chip) either above or below the layers comprising the main body of pixels. For example, this may be on the back of the chip, avoiding the areas occupied by the through chip connections. This may simplify the layout over most of the sub-array and allows the maximum area for the unit cell, although at the cost of some slightly more complicated routing along the edges and in the corners.

Another technique to reduce the possibility of edge pixel damage is to move any contact points such as connections between unit cell circuitry and the active detectors or emitters (such as emitter bridge structures or microbolometers) away from the edges that will undergo further processing. Examples of pad movement to the opposite edges or corners are shown in FIG. 5A, but would also apply in cases such as described with respect to FIGS. 4 and 6.

Modifying the Pixel Elements

In the case of detector or emitter pixels with structures smaller than the pitch size (for example microbolometer pixels or resistive array emitters), another technique can be applied to the edge and corner pixels to minimize risk of pixel failure. In this technique the edge and corner pixels have modified internal circuitry that keep the active portions of the pixel circuitry away from the edges (and corners) of the tile that will undergo further processing. In the event that an etch, dice or mill process encroaches onto the pixel body, the pixel may suffer some damage in its structure, including in the optically active area, but as long as the electrically active area (such as traces) are not affected the pixels may yet retain most of their functionality. In the case of a MEMS (micro-electromechanical systems) device such as a microbolometer or resistive array pixel, support structures (such as posts supporting bridges) may also be moved away from the affected tile edges. In the following figures, some examples may be shown of locating the electrically active area of pixel elements disposed at an edge of the tile susceptible to damage away from the edge of the tile while maintaining the optically active area as large as possible.

The concept that the active areas of some pixel elements may be different than others, to avoid edge damage, was mentioned above with respect to the technique 500 of FIG. 5. More particularly, it was suggested that the emitter or detector structures and pad (post) layout for edge pixels may differ from that of corner pixels (a special case of edge pixel), which may differ from that of interior (central) pixels which are not at an edge.

As mentioned above, some prior art describes tiling on two sides, such as by forming a 2×2 array of tiles (four total), each rotated 90 degrees with respect to the others. The techniques disclosed herein allow for tiling on all four sides of a (square) chip, thereby allowing arbitrarily large arrays to be manufactured from smaller tiles.

In the techniques described herein, three distinct types of pixel design are described. Indeed, a given pixel design may be rotated 180 degrees, depending on whether it lays along a right-side edge of the tile or a left-side edge of the tile (or top edge versus bottom edge), or 90 degrees depending on which of the four corners of the tile it is located at, but the concept here is to have three distinct designs for active areas of pixel elements, and generally one should not be exchanged for the other. In other words, it would not be beneficial to substitute an edge pixel design for a center pixel design, or for a corner pixel design, no matter how it is rotated.

FIGS. 7A, 7B, 7C illustrate that a sub-array tile may be implemented with MEMS pixel element designs that are tolerant to edge damage. Generally, rather than having one pixel element design for all of the pixel elements in the sub-array, there are different pixel designs for edge pixels (pixels which are disposed at an edge of the sub-array tile) having only one side susceptible to edge damage, corner pixels (pixels which are disposed at a corner of the sub-array tile) having two sides susceptible to edge damage and center pixels (which may be considered to be the "standard" or unmodified pixel design) which are those pixels which are not disposed along a tile edge. Generally, only posts and active traces within the pixels, such as resistors in microbolometer arrays or resistive arrays may be shown, for illustrative clarity.

The overall active area of a pixel element such as a thermal emitter may comprise an electrically active portion or area (or simply "electrical portion") such as an electrical trace or resistor, and an optically active portion or area (or simply "optical portion") such as a thermal mass heated by current flowing through the electrical trace. In FIGS. 7A and 7B, pixel elements which will reside at an edge or corner of a tile are shown having their electrical traces (electrically active areas) spaced away from the edge(s) of the tile susceptible to edge damage. The optical portions may be maintained as large as possible, and may extend as near to the edge(s) of the pixel as practical, including up to the edges of the tile, to reduce the apparent gap between adjacent tiles. Damage to the optical portion only will generally not render the pixel element non-functional, it will only slightly reduce its net active area, and the edge-damaged pixel element may still function reasonably well.

FIG. 7A shows a design for an edge pixel 712A, such as the pixel elements 512b,c,d,j,o,t,v,w,x,f,k,p shown in FIG. 5. An active area 740A comprises an electrically active portion 742A such as an electrical trace or resistor which is asymmetric, and "shrunk" in one direction (or "moved" away from one edge), leaving an edge-damage-tolerant (EDT) area along one side (right as shown) of the pixel 712A. The electrically active portion 742A does not extend into the EDT area. The optical portion 744A of the active area 740A may extend into this EDT area. For example, the EDT area disposed along one side of the pixel element may occupy a fraction of the pixel width (or pitch), such as at least 1%, at least 2%, at least 5%, at least 10%, at least 25% or the overall "active area". The two electrical contact points and mechanical support points ("posts") are both located on the same side of the pixel, opposite the edge of the pixel element susceptible to edge damage.

When implemented in the sub-array, the EDT area of the pixel 712A may be aligned at the edge of the sub-array tile. Hence, there may be four different orientations (EDT area facing up, EDT area facing right, EDT area facing down, EDT area facing left) for edge pixels 712A implemented in an array—although all edge pixels 712A may have the same design irrespective of which tile edge they are disposed along. This allows for pixel edge damage along that edge of the sub-array tile while avoiding pixel failure. In the example shown in FIG. 7A, the design is oriented as it would be for pixels 512j,o,t along the right edge of the sub-array tile. Representative "edge damage" is illustrated extending from the edge of the pixel into the EDT area, without adversely affecting the electrically active component (e.g. trace, resistor, contact), impacting only slightly upon the optical portion of the pixel element.

FIG. 7B shows a design 712B for a corner pixel, such as the pixel elements 512a,e,y,u shown in FIG. 5. Here, the electrically active area 742B of the active area 740B is asymmetric, moved away from two intersecting edges, in two directions (diagonally away from the sensitive corner), thus allowing for pixel edge damage along either of those two intersecting edges without causing pixel failure. Here it may be observed that the electrical contact points and mechanical support points ("posts") are located in a single corner of the pixel, which is opposite from the two sides (away from the other three other corners) that would be diced and subject to damage. The optical portion 740B may extend to those two edges.

Having two EDT areas in the design may necessitate that the electrically active area (for example the area occupied by the resistor in a microbolometer or emitter array) for the corner pixel 712B may be somewhat smaller than the active area for the edge pixel 712A. In a similar manner, the EDT areas of the pixel 712B may extend a small fraction of the pixel width from the edge of the pixel towards the interior of the pixel. (Of course, corner pixels 712B could be used for edge pixels which are not disposed at the corner of the sub-array tile, as well as for pixel element which are not edge pixels.) In FIG. 7B, the EDT area on the left side (as viewed) of the pixel element is shown slightly larger than the EDT area on the top side of the pixel element, to illustrate that they may be the same or different. The orientation of the illustrated pixel element 712B with its EDT areas on its top and left sides, is suitable for being implemented as the top-left pixel 512a of the tile 510 (FIG. 5). For the other three corner pixels 512e,y,u, the design may be orientated appropriately.

FIG. 7C shows a design 712C for a an interior (or center) pixel, such as the pixel elements 512g,h,l,m,n,q,r,s shown in FIG. 5. The active area 740C comprises an electrically active portion 742C and an optically active portion 744C. Since a pixel having this design will not be located at an edge (or corner), and therefore not susceptible to edge damage, this may be regarded as the "standard" pixel design. Generally, no EDT area is required in the design for a center pixel, and the electrical contact points and mechanical support points ("posts") are located in two opposite corners of the pixel.

Another technique to achieve similar results (edge damage tolerance) using the same design for all of the pixels in the array (rather than different designs for different classes of pixels—edge, corner, center) would be to move the electrically active circuitry towards the center of the pixel.

Figure 8:
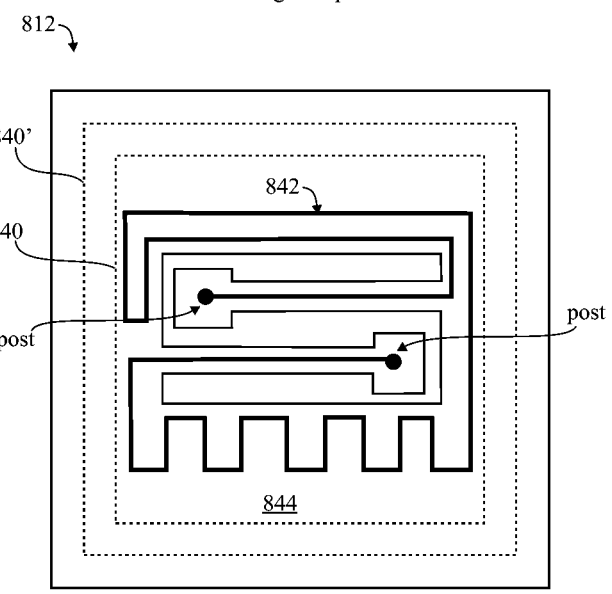
FIG. 8 is a plan view of a MEMS pixel, according to some embodiments of the invention.
Figure 9:
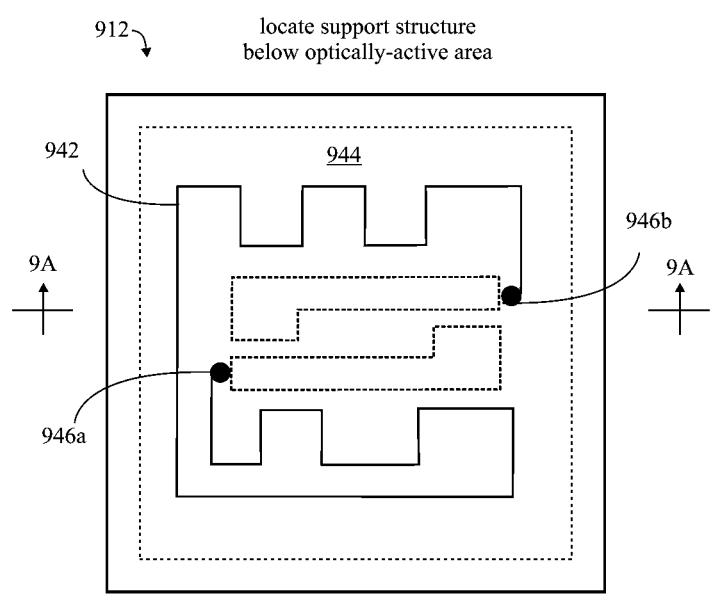
FIG. 9 is a plan view of a MEMS pixel, according to some embodiments of the invention.

As described above, edge damage tolerance may be improved by moving unit cell circuitry and/or the electrical trace of the active area away from edges of pixels that are located at the edges of tiles. FIGS. 8 and 9 describe moving the support structures (posts) to the center of the pixel (away from all edges) such that all edges of the pixel element may be tolerant of damage.

FIG. 8 shows a pixel element 812. The dashed line 840' show the "pre-moved" (standard) location of the active circuitry, which is normally substantially the same size as the pixel element 812. The dashed line 840 shows the "moved" (away from all four edges of the tile) location of the electrical trace 842 of the active circuitry. More particularly, the pads and legs ("posts") are in the center of the pixel 812 and the electrical trace (resistor) 842 is kept away from the edge. The optical portion 844 may extend substantially to all four edges of the pixel 812. This way, all pixels would be the same instead of needing a different design for sides/edges (FIG. 7A), corners (FIG. 7B) and interior/center (FIG. 7C).

For MEMS devices the support structures could also be moved to the center. FIG. 8 shows a symmetric MEMS pixel design that is tolerant of edge damage on all four sides. Active circuitry (resistor) is kept away from all (four) sides of the pixel element, thereby allowing a single pixel design to be used for the entire array (edges, corners, interior).

A similar technique that does not sacrifice the optical fill factor of a pixel would be to locate the center support structure below the optically active area of the pixel. An example of such a pixel is shown in FIG. 9.

Figure 9A:
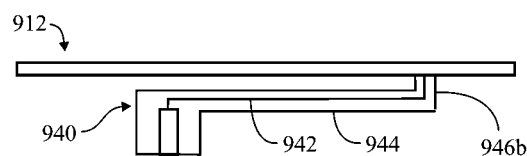
FIG. 9A is a cross-section of the MEMS pixel of FIG. 9.

FIGS. 9, 9A illustrate a symmetric MEMS pixel design that is tolerant of edge damage on all four sides with its two support structures 946a, 946b located underneath the active area 940 of the pixel element 912. The active area 940 may comprise an electrically active portion 942 and optically active portion 944.

There has thus been shown and described the following:

A method of fabricating and assembling a plurality of tiles having pixel elements to form a large array, comprising: providing back surface connections on the tiles; mounting the tiles on a routing layer having front surface connections; and connecting the back surface connections to the front surface connections using through chip routing techniques wherein vias are disposed below the pixel elements; further comprising: providing physical alignment features on side edges of the tiles; wherein the physical alignment features on a side edge of a given tile mate with the physical alignment features on a side edge of an adjacent tile in the array; wherein the physical alignment features comprise bump features protruding from side edges of the tiles and corresponding recess features extending into side edges of the tiles; and wherein the tiles may have convex polygonal shapes. The convex polygonal shapes may be selected from the group consisting of triangular, square, rectangular, parallelogram, trapezoidal, and hexagonal.

The tiles may be mounted with a sub-pixel size to zero gap at seams between adjacent tiles. Substantially all I/O may be routed through the back surface connections so that the tiles can be placed edge-to-edge on all sides. The alignment features may be located below the front surface of the tile. Electrical connection features may be provided on side edges of the tiles. The electrical connection features on a side edge of a given tile may connect with the electrical connection features on a side edge of an adjacent tile in the array and the electrical connections are located below the front surface of the tile.

Each tile may comprise: a first integrated circuit (IC-1) comprising analog portions of pixel elements; and a second integrated circuit (IC-2) comprising circuitry for the pixel elements; wherein the pixel elements are thermal radiating or detecting elements.

Each pixel element may comprise an electrically active area and optically active area, and unit cell circuitry associated with each pixel element, and some of the pixel elements are edge pixel elements disposed at the edges of tiles susceptible to damage, further comprising at least one of: making the unit cell circuitry smaller than the pixel element; locating the unit cell circuitry for edge pixel elements away from the edges of the tile; implementing an array of unit cell circuitry with a smaller pitch than the array of pixel elements; providing routing for a given unit cell circuitry which is located away from its associated the pixel element; making an electrically active area smaller than the pixel element; and locating the electrically active areas of edge pixel elements away from the edges of the tile.

Each pixel element may comprise an electrically active area and an optically active area and unit cell circuitry associated with each pixel element, and some of the pixel elements are edge pixel elements disposed at the edges of tiles susceptible to damage, further comprising making the unit cell circuitry smaller than the pixel element with which it is associated, wherein the unit cell circuitry is smaller than the pixel element by an amount selected from the group consisting of at least 1% smaller, at least 2% smaller, at least 5% smaller, at least 10% smaller, at least 20% smaller, at least 30% smaller, at least 40% smaller, and at least 50% smaller than the pixel element with which it is associated.

Each pixel element may comprise an electrically active area and an optically active area and unit cell circuitry associated with each pixel element, and some of the pixel elements are edge pixel elements disposed at the edges of tiles susceptible to damage, wherein: a pixel element disposed at an edge of the tile susceptible to damage is designed to have an edge damage tolerant (EDT) area along at least one edge of the pixel; the EDT area occupies a fraction of the pixel width by an amount is selected from the group consisting of at least 1%, at least 2%, at least 5%, at least 10%, at least 25%; the electrically active portion does not extend into the EDT area.

Each pixel element may comprise an electrically active area and an optically active area and unit cell circuitry associated with each pixel element, and some of the pixel elements are edge pixel elements disposed at the edges of tiles susceptible to damage, further comprising making the electrically active area smaller than the pixel element wherein for pixel elements where the electrically active area is made smaller, maintaining the optically active area as large as possible, including up to the edges of the tile.

An array comprising a plurality of smaller sub-array tiles, each sub-array tile comprising a plurality of pixel elements, characterized by: a routing layer having front surface connections; and back surface connections on the tiles for connecting with the front surface connections on the routing layer using through chip routing techniques wherein vias are disposed below the pixel elements; and physical alignment features on side edges of the tiles, separate from the pixel elements, for ensuring mechanical alignment and registration of the tiles with minimum sub-pixel sized gap therebetween; wherein the physical alignment features comprise bump features protruding from side edges of the tiles and corresponding recess features extending into side edges of the tiles; and wherein the tiles have convex polygonal shapes.

Electrical connection features may be provided on side edges of the tiles for effecting electrical connections between adjacent tiles. The tiles may be mounted to the routing layer with a sub-pixel size to zero gap at seams between adjacent tiles.

The pixel elements may comprise thermal emitters or detectors. The pixel elements may comprise electrically active areas and unit cell circuitry; and at least one of the electrically active areas and unit cell circuitry may be disposed in selected ones of the pixel elements to be away from edges of the tiles that may sustain edge damage during processing.

A method of fabricating and assembling a plurality of tiles having pixel elements to form a large array, wherein the tiles have convex polygonal shapes, wherein each pixel element comprises an electrically active area and optically active area, and unit cell circuitry is associated with each pixel element, wherein the pixel elements are disposed on top of the unit cell circuitry, and wherein and some of the pixel elements are edge pixel elements disposed at the edges of tiles susceptible to damage, may comprise: providing physical alignment features on side edges of the tiles, wherein the physical alignment features on a side edge of a given tile mate with the physical alignment features on a side edge of an adjacent tile in the array; and may further comprise at least one of: making the unit cell circuitry smaller than the pixel element with which it is associated; locating the unit cell circuitry for edge pixel elements away from the edges of the tile; implementing an array of unit cell circuitry with a smaller pitch than the array of pixel elements; providing routing for a given unit cell circuitry which is located away from its associated pixel element; making an electrically active area smaller than the pixel element; and locating the electrically active areas of edge pixel elements away from the edges of the tile; and may further comprise: a pixel element disposed at an edge of the tile susceptible to damage may be designed to have an edge damage tolerant (EDT) area along at least one edge of the pixel, and the EDT area occupies a fraction of the pixel width by an amount is selected from the group consisting of at least 1%, at least 2%, at least 5%, at least 10%, at least 25%, and the electrically active portion does not extend into the EDT area; and for pixel elements where the electrically active area may be made smaller, maintaining the optically active area as large as possible, including up to the edges of the tile.

Back surface connections may be provided on the tiles, the tiles may be mounted on a routing layer having front surface connections; and the back surface connections may be connected to the front surface connections.

The tiles may be mounted with a sub-pixel size to zero gap at seams between adjacent tiles. Substantially all I/O may be routed through the back surface connections so that the tiles can be placed edge-to-edge on all sides. Electrical connection features may be provided on side edges of the tiles, wherein the electrical connection features on a side edge of a given tile connect with the electrical connection features on a side edge of an adjacent tile in the array.

The unit cell circuitry may be made smaller than the pixel element by an amount selected from the group consisting of at least 1% smaller, at least 2% smaller, at least 5% smaller, at least 10% smaller, at least 20% smaller, at least 30% smaller, at least 40% smaller, and at least 50% smaller than the pixel element with which it is associated.

Some Additional Disclosure

As described hereinabove, sub-arrays such as tiles or chips having pixel elements may be arranged on a routing layer or carrier to form a larger array. Through-chip vias or the like to the backside of the chip may be used for connecting with the pixel elements. Edge features of the tiles may provide for physical alignment, mechanical attachment and chip-to-chip communication. Edge damage tolerance with minimal loss of function may be achieved by moving unit cell circuitry and the electrically active portions of a pixel element away from the tile edge(s) while leaving the optically active portion closer to the edge(s) if minor damage will not cause a complete failure of the pixel. The pixel elements may be thermal emitter elements for IR image projectors, thermal detector elements for microbolometers, LED-based emitters, or quantum photon detectors such as those found in visible, infrared and ultraviolet FPAs (focal plane arrays), and the like.

Tiling Flip-Chip Hybridized Arrays.

Tiling emitter arrays where the emitters are disposed on the RIIC is discussed earlier (see, e.g., FIGS. 7A,B,C). Other emitters and detectors may use emitter/detector material that is grown separately and then attached to the RIIC or ROIC in a process known as "hybridization".

Hybridization may be performed using various methods. One example is indium bump bonds where the two components or substrates may be joined (and electrically connected) through cold welding of indium bumps. (see for example U.S. Pat. No. 4,573,627). Another method is direct copper-to-copper bonding where copper posts protruding from both arrays are bonded together (WO 2003054954). A third example is the use of direct bonding where chips the arrays are bonded directly and metal vias in both arrays joined to make electrical contact (US 20040157407 A1). Any of these or other techniques which may be used herein to join two components face-to-face may be referred to simply as "flip-chip bonding" or "bump bonding", and the contacts formed on components being bump bonded together may be referred to as "bump contacts" or "bond pads".

Tiling hybridized arrays presents a further challenge compared to arrays grown directly on the RIIC. The additional misalignment between the hybridized emitters/detectors and the RIICs can cause unacceptable gaps between the tiled arrays or can lead to damage if the emitter/detector arrays come into contact when aligning and attaching neighboring tiles. Hybridization typically involves misalignments of a few microns (1-4 μm). For detector or emitter arrays with very small pixels, such as 10-25 μm, if neighboring tiles were offset in opposite directions away from each other, gaps of up to 8 μm could be present exceeding an acceptable gap of one-quarter (¼) the pixel size, which is generally taken to be the maximum for "seamless tiling", and far exceeding the goal of achieving a gap or one-tenth (¹/₁₀) of the pixel size. Conversely, if neighboring tiles were offset towards each other, an interference of several microns (μm) would result, potentially leading to damage along the edges of the tiles.

According to an aspect of the invention, the problem of additional misalignment may be alleviated by performing a singulation etch after the hybridization has occurred. In order to accomplish this, the emitter/detector design should accommodate slight misalignment of the singulation etch. As disclosed herein, an emitter or detector array may be "hybridized" onto a RIIC or ROIC using bumps such as indium or using other methods of "flip-chip bonding" such as direct bonding.

Hybridization, or joining of an emitter/detector array on one wafer to ROIC or RIIC circuitry on another wafer, can be performed at the wafer level, joining two wafers together, then performing a singulation process. Alternatively, the RIIC or ROIC can be diced out of its wafer so as to be larger than the final singulated emitter/detector array and then hybridized with the array wafer, and the final singulation etch may be performed on the diced array after hybridization. Similarly, the emitter or detector array can be a full wafer or it can be a diced to a size larger than the final singulated array. The overall objective is to form a tile or sub-array suitable for joining with other tiles to form a larger tiled array, wherein the individual hybridized tiles have physical alignment/attachment features on side edges thereof and the final, tiled array has minimal or no apparent gaps between the tiles.

As discussed hereinabove, FIGS. 1, 1A illustrate the basic concept of forming a tiled array 100 having a plurality of sub-arrays 110 (or small arrays, or tiles, or chips). Each tile 110 may be a semiconductor chip, comprising a plurality (such as an array) of pixel elements 112. A plurality of tiles 110 may be arranged (placed, mounted on) a routing layer 150, closely abutting one another, edge-to-edge (side-to-side), so that there is a sub-pixel size gap (such as <50 μm) between adjacent tiles 110. It is desirable to minimize the gaps between adjacent tiles, such as to ¼ of a pixel width, preferably less than ¹/₁₀ of a pixel width, for example, less than 5 μm. It may be generally desirable to match (as closely as possible) the coefficient of thermal expansion (CTE) of the routing layer 150 with the CTE of the tiles 110, then attach the two with a compliant but conductive layer of a material such as indium.

As further discussed hereinabove, the tiles 110 may be symmetric or asymmetric, and may typically be polygonal in shape, such as triangular, square, rectangular, parallelogram or trapezoidal, hexagonal, and the like, and typically all of the tiles will be the same shape as one another, although this concept can be extended to non-uniform tiling strategies. Two (or more) different tile shapes (or different orientations of the same shape, such as trapezoids having alternating up-down-up-down orientations) may be used to cover (populate, tile, tessellate) the overall larger array in a repeating pattern. In the main, hereinafter, populating a large array with smaller arrays which are square tiles will be discussed as representative of the techniques disclosed herein.

Generally, for populating an area with tiles, the tiles may be any of the geometric shapes described hereinabove (polygonal in shape, such as triangular, square, rectangular, parallelogram or hexagonal, and the like), or any other shape which is convex polygonal. A convex polygon is defined as a polygon with all its interior angles less than 180°. Any line drawn through a convex polygon will intersect the polygon exactly (and only) twice. Typically, the tiles will have straight sides (exclusive of alignment/attachment features which may project from the side edges of the tiles).

Some techniques for fabricating tiles or sub-arrays of pixel elements by joining an emitter/detector array with an ROIC/RIIC array will now be discussed.

In the main hereinafter, an emitter array having RIIC circuitry may be discussed, as exemplary of either emitter or detector arrays with RIIC or ROIC circuitry.

In the main hereinafter, the emitters of an array of emitters, such as disclosed herein, may be LEDs. The invention may relate broadly to infrared scene projection systems (IRSPs) and, more particularly to IRSPs using LEDs (light-emitting diodes) as thermal emitters. Light emitting diodes (LEDs) are useful as sources for infrared scene projection systems (IRSPs), and may offer some advantages over other thermal emitters (such as resistive elements), including potentially higher apparent temperatures and tunable output wavelength. Reference may be made to U.S. Pat. No. 9,078,333 7 Jul. 2015 for a further discussion of LEDs as thermal emitters, and drivers for the LEDs.

Figure 10A:
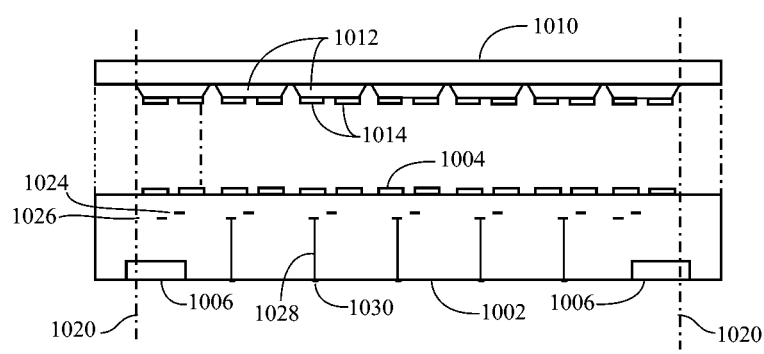
FIG. 10A is a cross-sectional view (exploded)

FIGS. 10A,B,C illustrate a technique for fabricating a tile 1000 or sub-array of pixel elements comprising (i) RIIC or ROIC circuitry on a first substrate, joined and connected ("hybridized") with an emitter/detector array on another substrate using contacts such as indium, a gap-filling adhesive such as epoxy, and edge alignment/attachment features such as copper nodules. In these figures, the assembly has not yet undergone singulation. FIG. 10C shows a tile or hybridized array of emitters/detectors and RIIC/ROIC circuitry after singulation (removal of excess material external to the resulting tile). The tile may be provided with physical alignment features as discussed above.

A first substrate 1002, such as a silicon wafer, may comprise a control circuitry component. The control circuitry may comprise unit cell circuitry 1024 (shown as dashes, compare 124) and control circuitry 1026 (shown as dashes, compare 126) such as a plurality (such as array) of read-in integrated circuits (RIIC) or read-out integrated circuits (ROIC) for operating the semiconductor elements such as pixel elements 1012 on a second substrate 1010. Through-chip routing 1028 (compare 128) from the control circuitry to back (bottom) side connections 1030 (compare 130) are shown for only some of the circuitry, for illustrative clarity. See FIG. 1A.

The circuitry component occupies a given area, smaller than the overall wafer, and the area corresponds to an area for an array of emitters or detectors formed on another substrate which will be hybridized to the RIIC/ROIC circuitry.

A plurality (or set) of "bump" contacts 1004 may be formed on a top (as viewed) surface of the substrate 1002. The bump contacts 1004 may comprise indium bumps, copper posts, or other or other electrically-conductive material, and may measure approximately 2-10 µm in width and 1-2 µm in height (but may be embedded in the substrate).

The substrate 1002 may also comprise alignment/attachment features 1006 on what will (after singulation) be side edges of a resulting hybridized tile. The alignment/attachment features 1006 are shown "generically", and may comprise mating bump features (compare 204) and recess features (compare 206), as described hereinabove with respect the tile 210. The edge alignment/attachment features may comprise copper nodules. The features may extend past the etch line 1020, may be recessed, may be V-shaped, etc.

A second substrate 1010, such as a semiconductor wafer comprising silicon or other material, such as gallium antimonide, may comprise a plurality of pixel elements 1012 (compare the pixels 112, discussed hereinabove) formed on a bottom (as viewed) surface thereof. The pixels may be thermal or solid state emitters or detectors, and may be arranged in an array. The resulting emitter/detector component may occupy a given area which is smaller than the overall area of the second substrate 1010. The pixel elements 1012 are an example of individual semiconductor elements disposed on a common substrate 1010.

The pixel elements may be LEDs measuring approximately 10-50 µm in width, 1-4 µm in height. Gaps between the pixels may be approximately 2-3 µm.

The substrate 1010 may have an initial thickness of 200-300 µm and, after forming the array of LEDs on its front surface, it may be back-lapped or other thinned to a final thickness of 20-30 µm. This may occur after hybridization (FIG. 10B) or after singulation (FIG. 10C).

A plurality (or set) of "bump" contacts 1014 may be formed on a bottom (as viewed) surface of the substrate 1010. The bump contacts 1014 may comprise indium bumps, copper posts, or other electrically-conductive material, and may measure approximately 2-10 µm in width and 1-2 µm in height (but may be embedded in the substrate).

The size/area of the array of emitters/detectors on the second substrate 1010 may be substantially equal to the area of the RIIC/ROIC circuitry on the first substrate 1002, both of which may be smaller than the substrates upon which they are respectively formed.

In a final step, after hybridizing (joining the two substrates together), a singulation process may be performed that separates the tile (sub-array) from the rest of the substrate and defines its final shape by removing excess substrate material (external to the resulting tile). FIG. 10C

As best viewed in FIG. 10A (prior to assembly), when the substrates 1002 and 1010 are brought together (joined with one another), the contacts 1004 will align with the contacts 1014, and may be electrically connected with one another, using conventional technology, such as cold welding of indium bumps or a low-temperature copper to copper bonding process.

The individual pixel elements 1012 may be LED devices functioning as emitters, may be somewhat trapezoidal (as shown) in cross-section, and there may be gaps between the pixels. As best viewed in FIG. 10B (after assembly), the gaps between pixels and the gap between the pixels and RIIC/ROIC substrate 1002 may be filled with an adhesive 1016, such as epoxy. For cases where large currents are needed, such as emitter arrays, each LED 1012 may be provided with two bump contacts 1014 for joining with corresponding two bump contacts 1004 on an associated RIIC circuit.

In this example (FIGS. 10A,B), there are two contacts (anode, cathode) per pixel. This would be conventional for emitters. In some cases, selected ones of the pixels may share a common cathode or anode (see FIG. 12). Detectors may only require one contact per pixel.

One or more circuitry components (RIIC/ROIC array) may be formed on a single substrate (wafer). One or more emitter/detector components may be formed on another single substrate. (wafer). Multiple circuitry components which are smaller than a given emitter/detector component may be joined to a single emitter/detector component. Proper alignment during hybridization (bump bonding) may be achieved with conventional bonding apparatus which may include an infrared (IR) camera looking through the silicon (wafer) during the process.

Figure 10B:
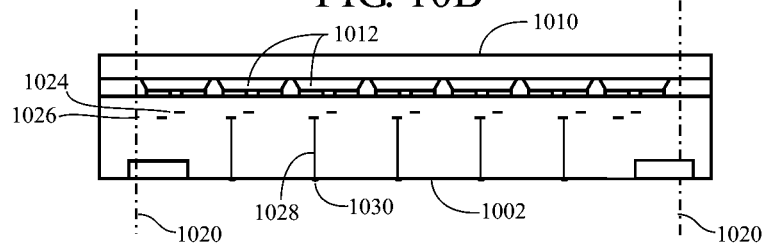
FIG. 10B is a cross-sectional view (assembled) of an RIIC/ROIC component with an emitter/detector array hybridized onto its top surface.
Figure 10C:
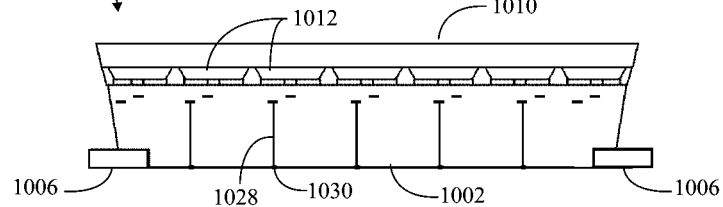
FIG. 10C is a cross-sectional view of the assembly shown in FIG. 10B, after singulating a resulting tile.

FIG. 10B shows that the substrates 1002 and 1010 may be joined, face-to-face, and the set of bump contacts 1004 may be connected with the set of bump contacts 1014, resulting in a hybridized array (or sub-array, or tile) of semiconductor elements (an electronic component such as an array of emitters or detectors) and control circuitry (an electronic component such as an array of RIIC/ROIC circuits) which may be singulated (separated) from the joined substrates. The hybridized array of semiconductor elements and control circuitry extends over an area (between the lines 1020) which is smaller than an overall surface area of the substrates. Singulating the hybridized array may comprise removing an outer area (outside the lines 1020) of the substrates. Alignment features 1006 extend from edges of the hybridized array for facilitating tiling a plurality of hybridized arrays into a larger array which may be disposed on a routing layer (150, FIGS. 1, 1A).

With respect to the substrate 1010, the dashed lines 1020 represent the edges of the emitter/detector component, or optically active area—in other words, an area of the substrate 1010 which is covered by pixels 1012. Substrate material in an area outside of the optically active area (outside of the dashed lines 1020) may be removed by any suitable process, and this may be done after the two substrates 1002 and 1010 are hybridized—assembled and connected with one another (FIG. 10B).

Similarly, with respect to the substrate 1002, the dashed lines 1020 represent the edges of the circuitry component—in other words, an area of the substrate 1002 which comprises RIIC/ROIC circuitry, or the like. Substrate material outside of the circuitry area may be removed by any suitable process, and this may be done after the two substrates 1002 and 1010 are hybridized (assembled and connected with one another (FIG. 10B).

FIG. 10C shows the assembly of FIG. 10B, after singulation of the hybridized emitter/detector RIIC/ROIC array has been performed. Singulation may be performed with an ion mill dry etch, reactive ion etch, or the like, and may be biased (resulting in non-straight edges) to ensure that some of the alignment features 1006 may be exposed or revealed (project or protrude beyond the edges of the tile, compare 204, FIG. 2A), and to minimize the likelihood of arrays being separated by small deviations in the etch. The overall purpose of the etch is to singulate the resulting hybridized tile from their respective substrates 1002/1010. A wet etch may be used to perform the singulation, and may be a selective etch or a masked process.

In this manner, individual tiles (sub-arrays) having a plurality of pixels may be fabricated by hybridizing a first component comprising a plurality of pixel elements (such as an array thereof) onto a second component comprising corresponding control circuitry (such as an array of control circuits).

The final hybridized tile or sub-array 1000 (FIG. 10C) of emitters or detectors may be square or rectangular, and measure approximately 12 mm-50 mm on a side. This corresponds to the size of the individual emitter/detector array component and circuitry component. There may be from several hundreds up to over a million of resulting pixels comprising emitters/detectors and RIIC/ROIC circuits on a single tile. The resulting hybridized tile 1000 (FIG. 10C) is noticeably different than the tiles shown (for example) in FIG. 1A in that the pixel array has been hybridized onto the RIIC/ROIC array.

Hybridized tiles 1000 may be mounted to a routing layer (not shown) in the manner that the tiles 100 are mounted to a routing layer 150 (see FIGS. 1, 1A).

FIGS. 11A,B shows a large array 1100 (compare tiled array 100) comprising a plurality of smaller hybridized tiles which are joined at their edges. Two such tiles 1000A and 1000B are shown, each of which may correspond with the hybridized tile 1000 shown in FIG. 10C. In the plan view (FIG. 11A), the dashed lines extending from the bottom and to the right of the two hybridized tiles indicates that there may be several more hybridized tiles joined with the two tiles shown to form the large array. Refer to FIGS. 1, 1A which shown arrays of tiles disposed on a routing layer 150.

FIG. 11A shows that each tile has a plurality of pixels 1112 arranged in a rectangular array. The pixel labeled "1112c" is a corner pixel. The pixel labeled "1112e" is an edge pixel. The edge (and corner) pixels may be slightly smaller than pixels interior to the array, to prevent edge damage from the singulation etch. Hence, the active area of edge and corner pixels may be smaller than the active area of the center (non-edge) pixels. For example:
the interior pixels may measure approximately 10-15 μm×10-15 μm, and may be substantially square)
the edge pixels may measure approximately 2-5 μm smaller than the interior pixels in one or both dimensions, and may be approximately at least 10% smaller (in area) than the interior pixels, including at least 15% smaller, 20% smaller, and 25% smaller.

FIG. 11A shows that there may be two connections per pixel, which is common for emitters that require high currents. (Detectors typically have only one bond or connection per pixel.) In the figure, contacts (such as bond pads) 1114 are shown for only some of the pixels 1112 (those in the lower left corner of the left tile, and in the lower right corner of the right tile) are shown, for illustrative clarity. In this figure, each electronic component (emitter pixel) has two bond pads associated therewith. The bond pads (bump contacts) for corner and edge pixels may be smaller, and spaced farther from edge of the array than the bond pads of center (interior, rather than edge) pixels. For example:
the contacts on interior pixels may be rectangular, measuring approximately 6-7 μm×10-15 μm
the contacts on edge or corner pixels may be smaller than the contacts on interior pixels in one or both dimensions, measuring approximately 3-4 μm×15 μm, or 7 μm×10 μm.

Figure 12:
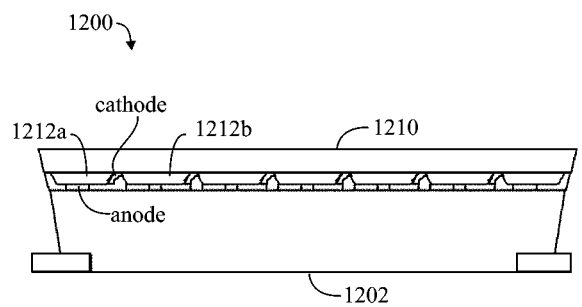
FIG. 12 is a cross-sectional view of a hybridized tile.

FIG. 12 shows a hybridized tile 1200, similar to the hybridized tile 1000 described hereinabove. A plurality of pixel elements 1212 (compare 1012) are formed on a substrate 1210 (compare 1010) which is joined with RIIC/ROIC circuitry formed on another substrate 1202 (compare 1002). In this embodiment, the edge pixels, including corner pixels, may have only a single bump contact (anode) and utilize the contacts of the center pixels (which each have two contacts, as in 1100) to make contact to a common plane, such as a common cathode. A pixel 1212a is shown having one bump contact (labeled "anode"), and may share a common contact (labeled "cathode") with a neighboring pixel 1212b. This example would be similar if a common anode device were used, with the anode and cathode contacts exchanged.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. A large array of hybridized tiles, a given hybridized tile of semiconductor elements and control circuitry comprising:
a first electronic component comprising a plurality of individual semiconductor elements on a first substrate;
a first set of bump contacts disposed on the individual semiconductor elements;
a second electronic component comprising control circuitry on a second substrate for operating the semiconductor elements; and
a second set of bump contacts on the second substrate; wherein:
the first and second substrates are joined, face-to-face, and the first set of bump contacts is connected with the second set of bump contacts, resulting in a hybridized tile of semiconductor elements and control circuitry extending over an area which is smaller than an overall surface area of the first and second substrates and which is singulated from the first and second substrates;
further comprising:
back surface connections on each of a plurality of hybridized tiles;
the plurality of hybridized tiles are mounted on a routing layer having front surface connections; and
the back surface connections of the hybridized tiles are connected to the front surface connections of the routing layer.

2. The large array of hybridized tiles of claim 1, wherein:
the semiconductor elements comprise emitters or detectors; and
the control circuitry comprises read in circuitry (RIIC) or read out circuitry (ROTC).

3. The large array of hybridized tiles of claim 1, further comprising:
the alignment features extend from edges of the hybridized tile for facilitating tiling a plurality of hybridized tiles into the large array.

4. The large array of hybridized tiles of claim 3, wherein:
physical alignment features are provided on side edges of the hybridized tiles; and
the physical alignment features on a side edge of a given tile are capable of mating with the physical alignment features on a side edge of an adjacent tile in the large array of tiles.

5. The large array of hybridized tiles of claim 4, wherein:
the physical alignment features comprise bump features protruding from side edges of the tiles and corresponding recess features extending into side edges of the tiles.

6. The large array of hybridized tiles of claim 1, further comprising:
electrical connection features disposed on at least some side edges of the tile;
wherein the electrical connection features on a side edge of the tile connect with electrical connection features on a side edge of an adjacent tile in the large array of tiles.

7. The large array of hybridized tiles of claim 1, wherein:
the first and second substrates comprise semiconductor wafers.

8. A method of making a hybridized array of semiconductor elements and control circuitry comprising:
providing a plurality of individual semiconductor elements on a first substrate;
providing a first set of bump contacts on the individual semiconductor elements;
providing control circuitry on a second substrate for operating the semiconductor elements;
providing a second set of bump contacts on the second substrate;
joining the first and second substrates, face-to-face, and connecting the first set of bump contacts with the second set of bump contacts; and
after joining the first and second substrates, singulating a resulting hybridized array of semiconductor elements and control circuitry from the first and second substrates;
further comprising:
providing back surface connections on each of a plurality of hybridized arrays;
mounting the plurality of hybridized arrays on a routing layer having front surface connections; and
connecting the back surface connections to the front surface connections using through chip routing techniques wherein vias are disposed below the pixel elements.

9. The method of claim 8, further comprising:
mounting the hybridized arrays with a sub-pixel size to zero gap at seams between adjacent hybridized arrays.

10. The method of claim 8, wherein:
the semiconductor elements comprise radiating or detecting elements.

11. The method of claim 8, wherein:
the semiconductor elements comprise emitters or detectors; and
the control circuitry comprises read in circuitry (RIIC) or read out circuitry (ROTC).

12. The method of claim 8, further comprising:
providing physical alignment features on side edges of the hybridized arrays;
wherein the physical alignment features on a side edge of a given hybridized array are capable of mating with the physical alignment features on a side edge of an adjacent hybridized array in an array of hybridized arrays.

13. The method of claim 12, wherein:
the physical alignment features comprise bump features protruding from side edges of the hybridized arrays and corresponding recess features extending into side edges of the hybridized arrays.

14. The method of claim 13, wherein:
singulating comprises removing an outer area of the first and second substrates, and
singulating reveals the physical alignment features.

15. The method of claim 8, wherein:
the first and second substrates comprise semiconductor wafers.

* * * * *